(12) United States Patent
Park et al.

(10) Patent No.: US 12,349,443 B2
(45) Date of Patent: Jul. 1, 2025

(54) GATE STRUCTURES AND SEMICONDUCTOR DEVICES INCLUDING THE SAME

(71) Applicant: Samsung Electronics Co., Ltd., Suwon-si (KR)

(72) Inventors: Taejin Park, Yongin-si (KR); Jangeun Lee, Hwaseong-si (KR); Huijung Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 663 days.

(21) Appl. No.: 17/723,535

(22) Filed: Apr. 19, 2022

(65) Prior Publication Data

US 2023/0006050 A1 Jan. 5, 2023

(30) Foreign Application Priority Data

Jun. 30, 2021 (KR) ........................ 10-2021-0085593

(51) Int. Cl.
| | | |
|---|---|---|
| *H01L 23/00* | (2006.01) | |
| *H10B 12/00* | (2023.01) | |
| *H10D 64/01* | (2025.01) | |
| *H10D 64/27* | (2025.01) | |

(52) U.S. Cl.
CPC ......... *H10D 64/518* (2025.01); *H10B 12/053* (2023.02); *H10B 12/315* (2023.02); *H10B 12/34* (2023.02); *H10D 64/01* (2025.01); *H10D 64/513* (2025.01); *H10D 64/514* (2025.01); *H10B 12/0335* (2023.02)

(58) Field of Classification Search
CPC .... H10D 64/518; H10D 64/01; H10D 64/513; H10D 64/514; H10D 84/00; H10D 48/345; H10D 18/60; H10B 12/053; H10B 12/315; H10B 12/34; H10B 12/0335; A01G 13/38; A01G 13/33; A61K 40/436; H10H 20/0364; H01L 21/28026; A23B 2/783

See application file for complete search history.

(56) References Cited

U.S. PATENT DOCUMENTS

| | | |
|---|---|---|
| 9,768,177 B2 | 9/2017 | Nobuto |
| 9,865,496 B2 | 1/2018 | Kim et al. |
| 10,256,136 B2 | 4/2019 | Kim et al. |
| 10,304,943 B2 | 5/2019 | Lee et al. |
| 10,395,973 B2 | 8/2019 | Kim et al. |
| 10,553,590 B2 | 2/2020 | Kim |
| 10,833,088 B2 | 11/2020 | Im et al. |
| 10,910,224 B2 | 2/2021 | Jang et al. |

(Continued)

FOREIGN PATENT DOCUMENTS

| | | |
|---|---|---|
| CN | 101339918 A | 1/2009 |
| CN | 103579122 A | 2/2014 |

(Continued)

*Primary Examiner* — Samuel Park
(74) *Attorney, Agent, or Firm* — Myers Bigel, P.A.

(57) ABSTRACT

A gate structure may include a first gate electrode extending in a first direction, a second gate electrode on a portion of the first gate electrode, a gate mask on the first and second gate electrodes, and a gate insulation pattern on a lower surface and a sidewall of the first gate electrode and sidewalls of the second gate electrode and the gate mask. The gate structure is in an upper portion of a substrate. A grain size of the second gate electrode is greater than a grain size of the first gate electrode.

20 Claims, 31 Drawing Sheets

(56) References Cited

U.S. PATENT DOCUMENTS

| | | | |
|---|---|---|---|
| 11,004,854 B2 | 5/2021 | Nam | |
| 2007/0145416 A1* | 6/2007 | Ohta | H10D 30/668 |
| | | | 257/213 |
| 2009/0029539 A1 | 1/2009 | Sung et al. | |
| 2011/0316064 A1* | 12/2011 | Kim | H10B 41/20 |
| | | | 257/314 |
| 2015/0228491 A1* | 8/2015 | Kang | H01L 29/4958 |
| | | | 257/330 |
| 2016/0190266 A1* | 6/2016 | Oyu | H10D 64/517 |
| | | | 257/330 |
| 2016/0336414 A1* | 11/2016 | Kang | H10D 64/513 |
| 2018/0130707 A1 | 5/2018 | Clendenning et al. | |
| 2019/0198630 A1* | 6/2019 | Lee | H10D 62/115 |
| 2020/0235114 A1 | 7/2020 | Oh | |

FOREIGN PATENT DOCUMENTS

| | | |
|---|---|---|
| KR | 20170075854 A | 7/2017 |
| KR | 20190010235 A | 1/2019 |
| KR | 20200057289 A | 5/2020 |

* cited by examiner

FIG. 32
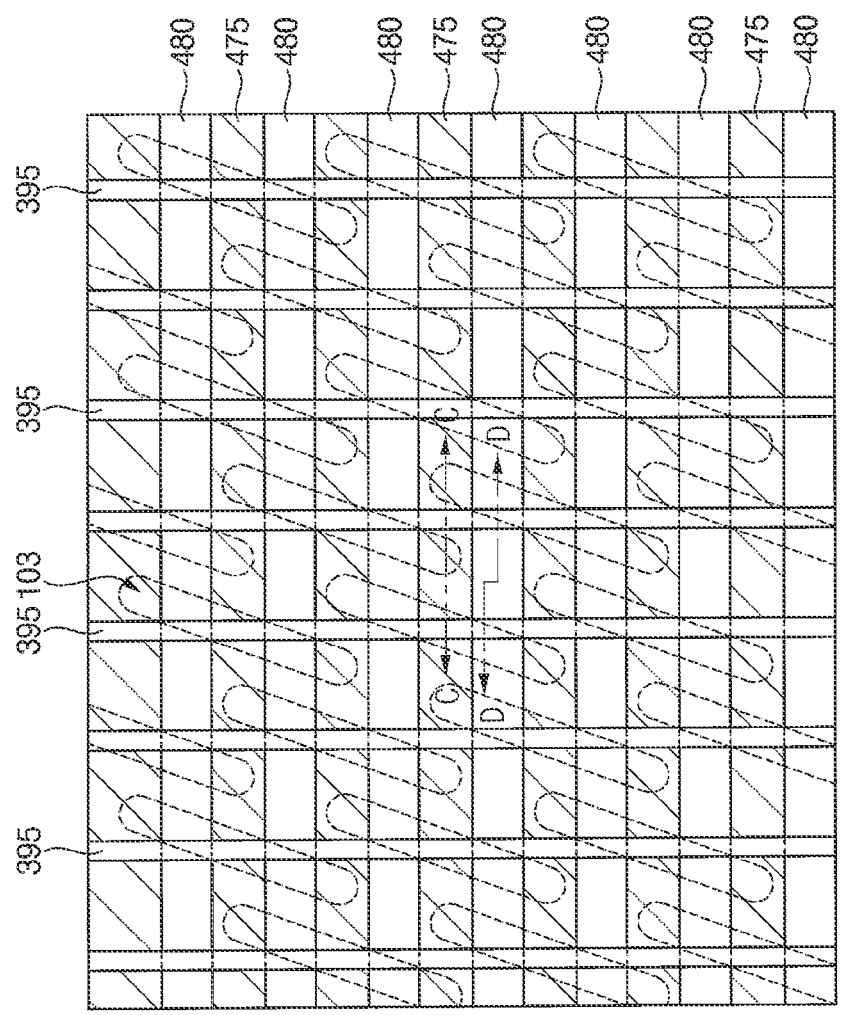
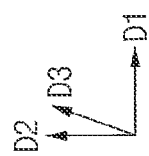

FIG. 34
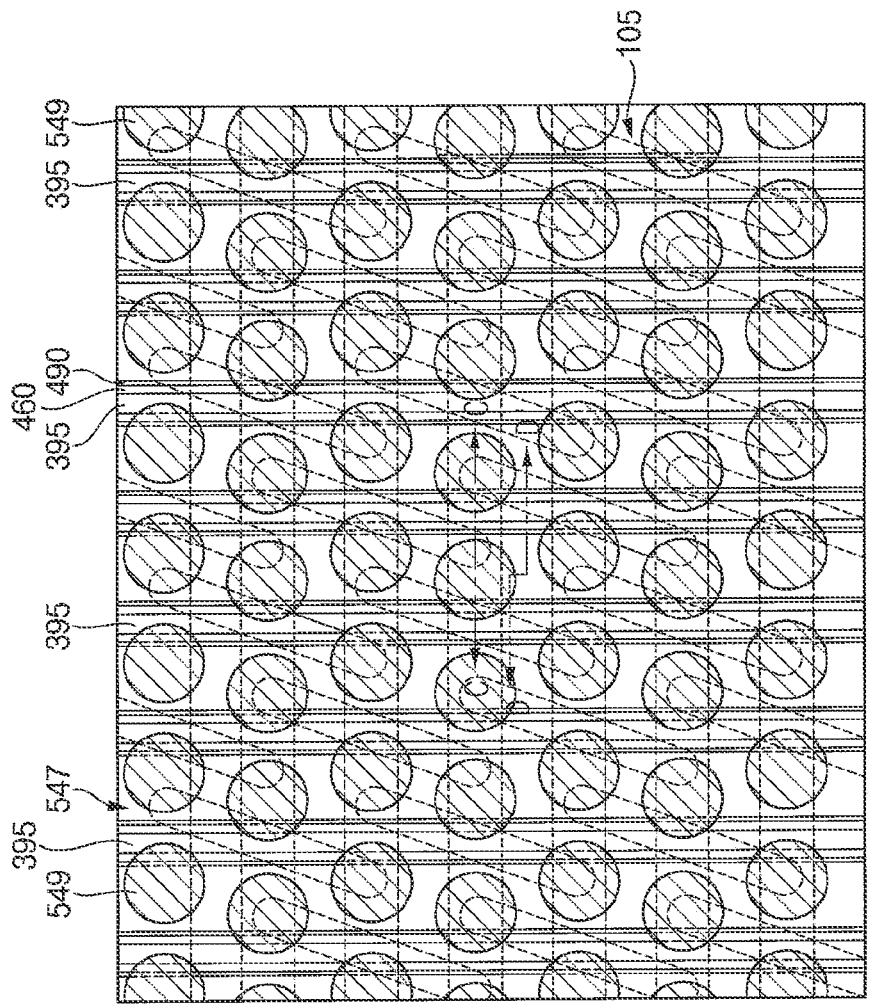
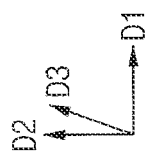

GATE STRUCTURES AND SEMICONDUCTOR DEVICES INCLUDING THE SAME

CROSS-REFERENCE TO RELATED APPLICATION

This application claims priority under 35 U.S.C. § 119 to Korean Patent Application No. 10-2021-0085593 filed on Jun. 30, 2021 in the Korean Intellectual Property Office, the disclosure of which is hereby incorporated by reference in its entirety.

BACKGROUND

The present disclosure relates to the field of electronics and, more particularly, a gate structure and a semiconductor device including the same.

In a DRAM device, a buried gate structure may be formed by forming a recess on a substrate, forming an insulation layer on an inner wall of the recess, and forming a gate electrode on the gate insulation layer to fill the recess. When the gate electrode is formed, layers (e.g., a pad layer, an active pattern, an isolation pattern, etc.) adjacent the gate electrode may be bent due to compressive or tensile stress.

SUMMARY

Example embodiments provide a gate structure having improved characteristics.

Example embodiments provide a semiconductor device including a gate structure having improved characteristics.

According to example embodiments of the inventive concepts, there is a gate structure. The gate structure may include a first gate electrode extending in a first direction, a second gate electrode on a portion of the first gate electrode, a gate mask on the first and second gate electrodes, and a gate insulation pattern on a lower surface and a sidewall of the first gate electrode and sidewalls of the second gate electrode and the gate mask. The gate structure may be in an upper portion of a substrate. A grain size of the second gate electrode may be greater than a grain size of the first gate electrode. In some embodiments, the gate structure may be buried in the upper portion of the substrate.

According to example embodiments of the inventive concepts, there is a gate structure. The gate structure may include a first gate electrode extending in a first direction, a first gate mask on a first region of the first gate electrode, a second gate mask on a second region of the first gate electrode, and a gate insulation pattern. The second gate mask may be formed on a second region of the first gate electrode, and may include a lower portion having a first width in a second direction crossing the first direction and an upper portion on and contacting the lower portion, which may have a second width in the second direction greater than the first width. The gate insulation pattern may be formed on a lower surface and a sidewall of the first gate electrode, a sidewall of the first gate mask, and a sidewall of a lower portion of the second gate mask, and may contact a portion of a lower surface of an upper portion of the second gate mask. The gate structure may be in an upper portion of a substrate. In some embodiments, the gate structure may be buried in the upper portion of the substrate.

According to example embodiments of the inventive concepts, there is a semiconductor device. The semiconductor device may include an active pattern on a substrate, an isolation pattern on (e.g., covering) a sidewall of the active pattern, a gate structure in upper portions of the active pattern and the isolation pattern, a bit line structure contacting a central portion (e.g., a central portion in a longitudinal direction) of an upper surface of the active pattern, a contact plug structure contacting an edge portion (e.g., an edge portion in the longitudinal direction) of the upper surface of the active pattern, and a capacitor on the contact plug structure. The gate structure may extend in a first direction parallel to an upper surface of the substrate. The bit line structure may extend in a second direction parallel to the upper surface of the substrate and perpendicular to the first direction. The gate structure may include a first gate electrode extending in the first direction, a second gate electrode on a portion of the first gate electrode, a gate mask on the first and second gate electrodes, and a gate insulation pattern on a lower surface and a sidewall of the first gate electrode and sidewalls of the second gate electrode and the gate mask. A grain size of the second gate electrode may be greater than a grain size of the first gate electrode. In some embodiments, the gate structure may be buried in the upper portions of the active pattern and the isolation pattern.

The gate structure in accordance with example embodiments may not be bent but may extend straightly in a direction, and thus may have uniform electrical characteristics.

BRIEF DESCRIPTION OF THE DRAWINGS

FIGS. 22 to 36 are views illustrating a method of manufacturing a semiconductor device in accordance with example embodiments.

DETAILED DESCRIPTION

The above and other aspects and features of gate structures and methods of forming the same, and semiconductor devices including the gate structure and methods of manufacturing the same in accordance with example embodiments will become readily understood from detail descriptions that follow, with reference to the accompanying drawings. It will be understood that, although the terms "first," "second," and/or "third" may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second or third element, component, region, layer or section without departing from the teachings of inventive concept. As used herein, an element or region that is "covering" or "filling" another element or region may completely or partially cover or fill the other element or region, and the term "and/or" includes any and all combinations of one or more of the associated listed items. Further, "an element A extends in a direction X" (or similar language) may mean that the element A extends longitudinally in the direction X.

Hereinafter, in the specifications (but not necessarily in the claims), two directions substantially parallel to an upper surface of a substrate and substantially perpendicular to each other may be referred to as first and second directions D1 and D2, respectively, and a direction substantially parallel to the upper surface of the substrate and having an acute angle with respect to the first and second directions D1 and D2 may be referred to as a third direction D3.

FIGS. 1 to 10 are views illustrating a method of forming a gate structure in accordance with example embodiments. Particularly, FIGS. 1, 4, 7 and 9 are plan views, and FIGS. 2-3, 5-6, 8 and 10 are cross-sectional views taken along A-A' lines of corresponding plan views, respectively.

Figure 1:
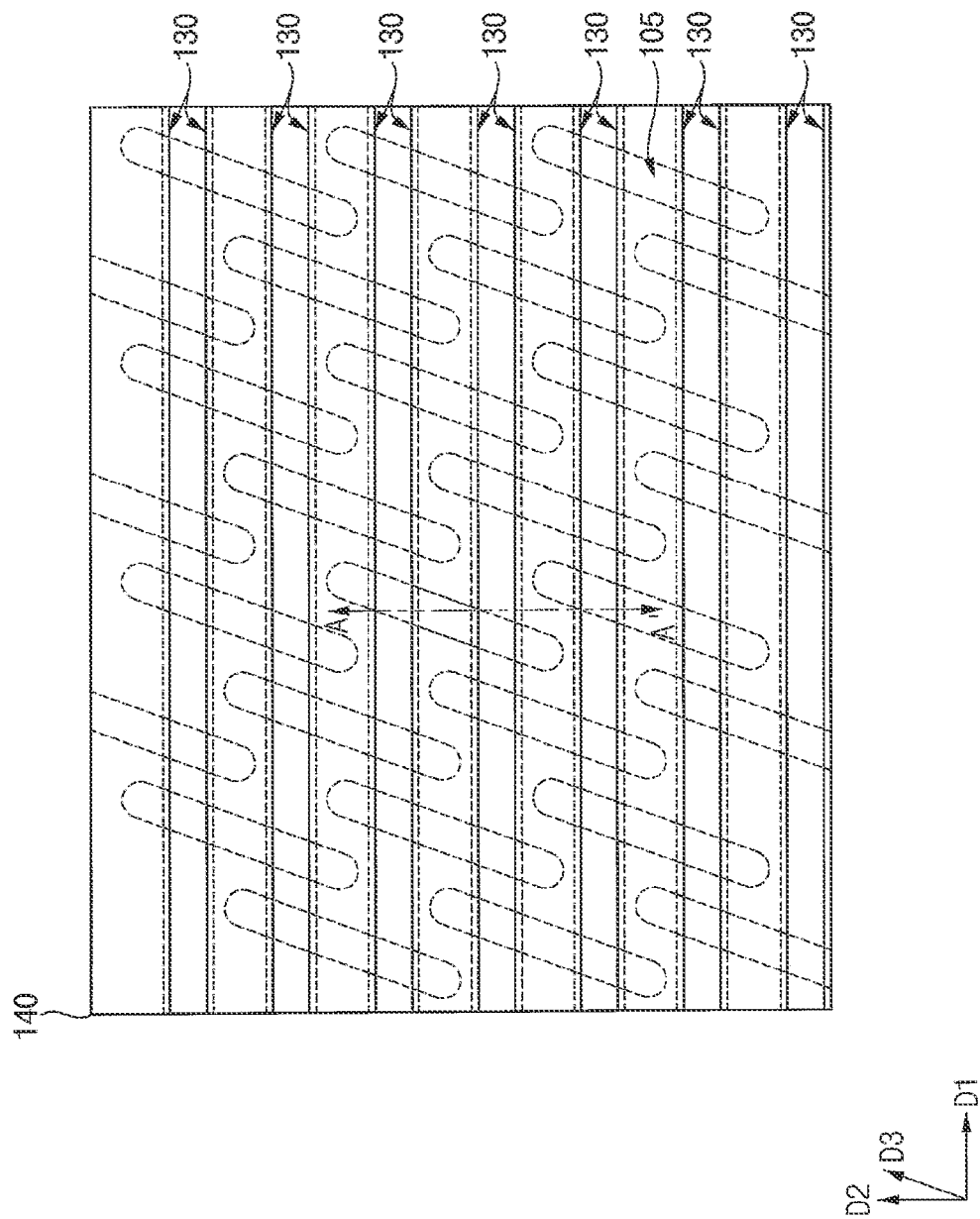
FIGS. 1 to 10 are views illustrating a method of forming a gate structure in accordance with example embodiments.
Figure 2:
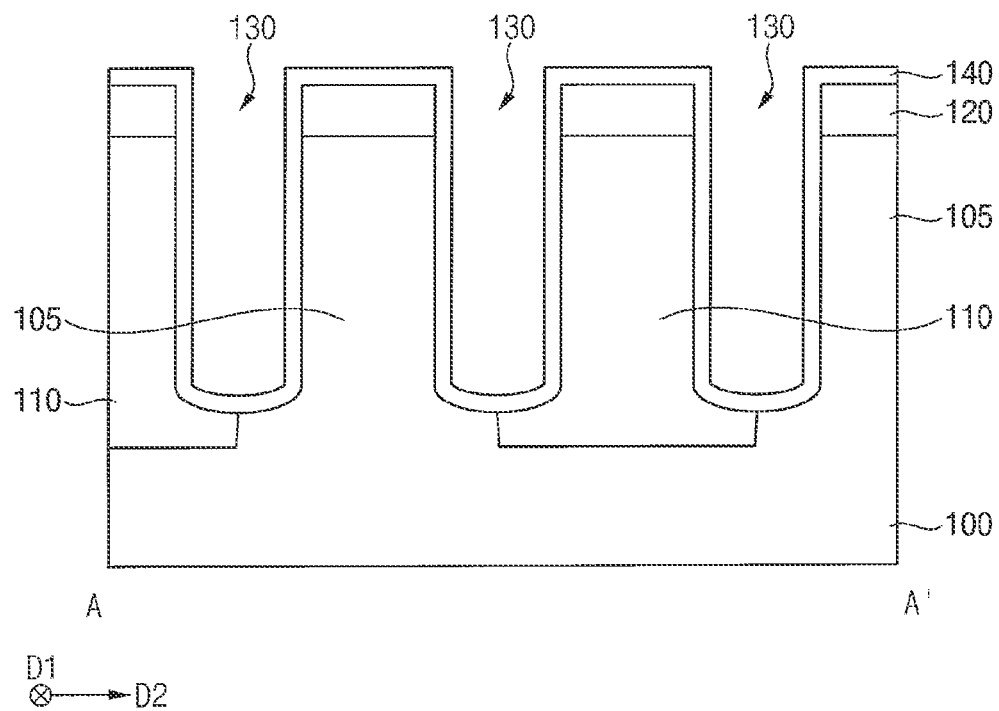

Referring to FIGS. 1 and 2, an active pattern 105 may be formed on a substrate 100, and an isolation pattern 110 may be formed to cover a sidewall of the active pattern 105.

The substrate 100 may include, for example, silicon, germanium, silicon-germanium, or a III-V group compound semiconductor, such as GaP, GaAs, or GaSb. In example embodiments, the substrate 100 may be a silicon-on-insulator (SOI) substrate or a germanium-on-insulator (GOI) substrate.

The active pattern 105 may be formed by removing an upper portion of the substrate 100 to form a first recess, and a plurality of active patterns 105 may be formed to be spaced apart from each other in each of the first and second directions D1 and D2. Each of the plurality of active patterns 105 may extend in the third direction D3.

The isolation pattern 110 may include, for example, an oxide, e.g., silicon oxide.

A pad layer 120 may be formed on the active pattern 105 and the isolation pattern 110, an etching mask including, e.g., an amorphous carbon layer (ACL) or spin-on hard mask (SOH), may be formed on the pad layer 120, and the pad layer 120, the active pattern 105 and the isolation pattern 110 may be partially etched using the etching mask to form a second recess 130 extending in the first direction D1. In example embodiments, a plurality of second recesses 130 may be spaced apart from each other in the second direction D2.

The etching mask may be removed by, e.g., an ashing process and/or a stripping process, and the pad layer 120 may be exposed.

A gate insulation layer 140 may be conformally formed on an inner wall of the second recess 130 and an upper surface of the pad layer 120. The gate insulation layer 140 may include, for example, an oxide, e.g., silicon oxide. In some embodiments, the gate insulation layer 140 may have a uniform thickness along the inner wall of the second recess 130 and the upper surface of the pad layer 120 as illustrated in FIG. 2.

A barrier layer may be further formed on the gate insulation layer 140, and the barrier layer may include, for example, a metal nitride, e.g., titanium nitride, tantalum nitride, etc.

Figure 3:
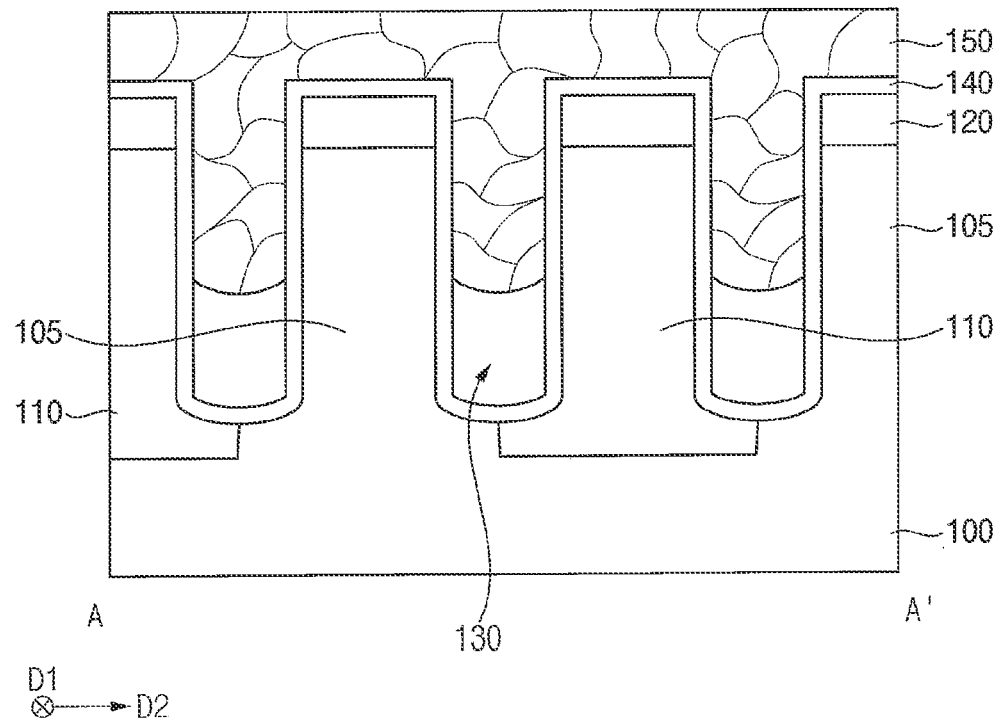

Referring to FIG. 3, a support gate electrode layer 150 may be formed to partially fill the second recess 130.

In example embodiments, the support gate electrode layer 150 may be formed by a physical vapor deposition (PVD) process, and thus may have a relatively large grain size. For example, the support gate electrode layer 150 may include a metal, e.g., tungsten, molybdenum, etc., a metal nitride, e.g., titanium nitride, tantalum nitride, etc., a metal silicon, doped polysilicon etc.

The support gate electrode layer 150 may fill an upper portion of each of the second recesses 130 and may also be formed on a portion of the gate insulation layer 140 on the pad layer 120. Thus, a lower portion of each of the second recesses 130 may not be filled with the support gate electrode layer 150.

Figure 4:
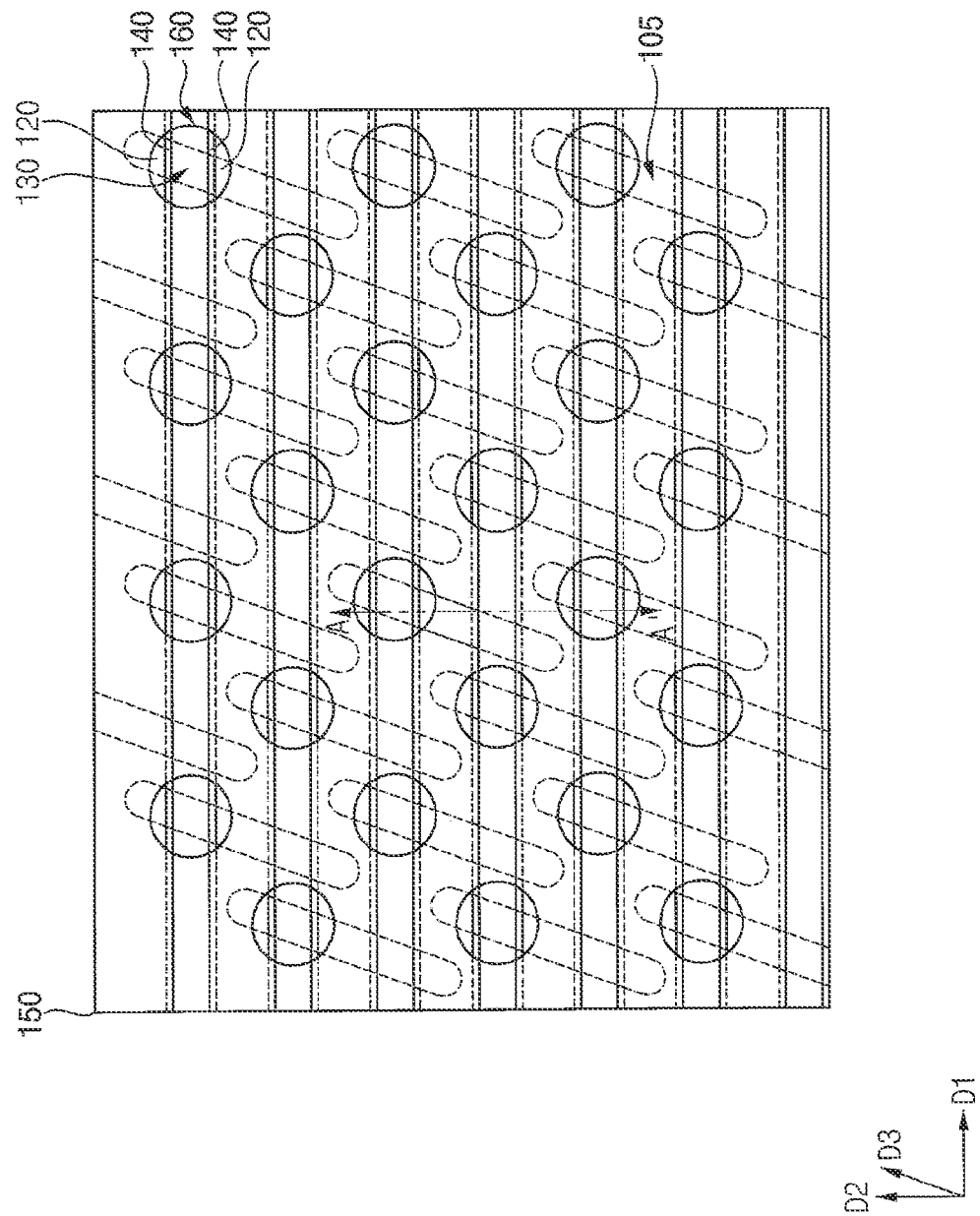
Figure 5:
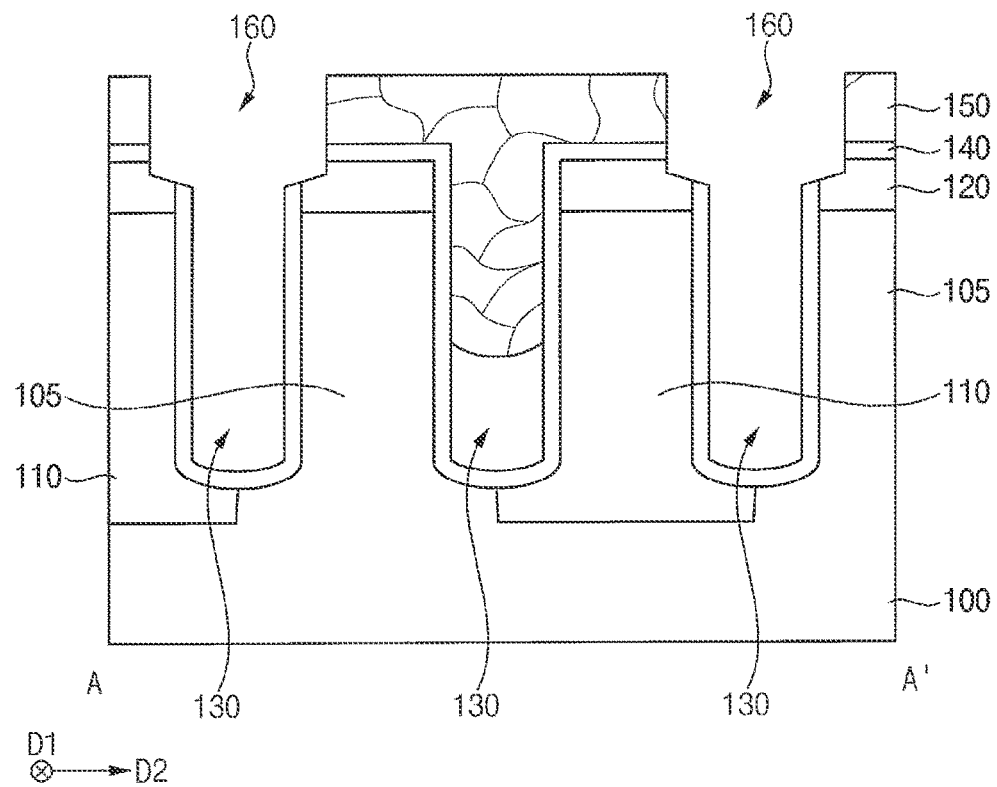

Referring to FIGS. 4 and 5, the support gate electrode layer 150 and the gate insulation layer 140 thereunder may be partially removed to form a third recess 160.

The third recess 160 may expose a portion of the support gate electrode layer 150 in the second recess 130 and may also expose a portion of the gate insulation layer 140 and the pad layer 120 adjacent to the portion of the support gate electrode layer 150. In example embodiments, a plurality of third recesses 160 may be spaced apart from each other in the first direction D1 on each of the second recesses 130 extending in the first direction D1. Thus, a plurality of third recesses 160 may be spaced apart from each other in each of the first and second directions D1 and D2.

FIG. 4 shows that the third recess 160 has a shape of a circuit in a plan view, however, the inventive concept may not be limited thereto, and the third recess 160 may have various shapes, e.g., a shape of an ellipse, polygon, polygon with rounded corners, etc.

A portion of the support gate electrode layer 150 remaining in each of the second recesses 130 that is exposed by the third recess 160 may be removed, and thus the third recess 160 may be connected with the second recess 130.

Only the portion of the support gate electrode layer 150 on a portion of each of the second recesses 130 has been removed to form the third recess 160 and the portion of the support gate electrode layer 150 exposed by the third recess 160 has been removed, and thus a portion of the support gate electrode layer 150 in and on other portions of each of the second recesses 130 may still remain.

Figure 6:
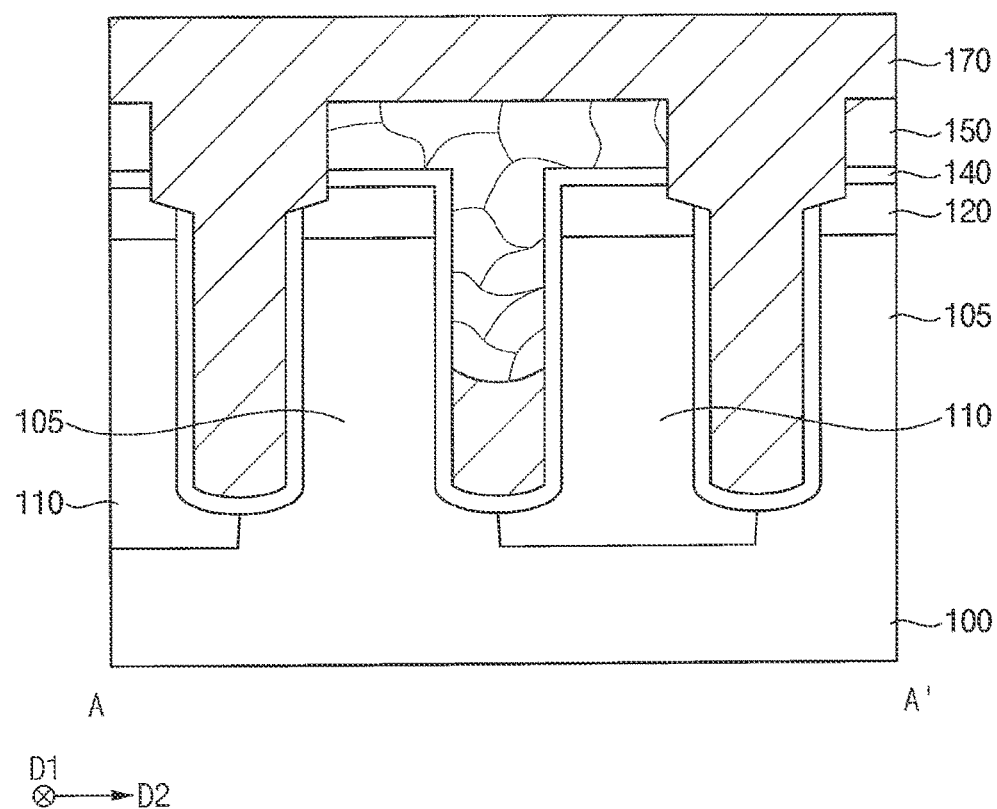

Referring to FIG. 6, a gate electrode layer 170 may be formed to fill the second and third recesses 130 and 160 and may also be formed on the support gate electrode layer 150.

In example embodiments, the gate electrode layer 170 may be formed by a chemical vapor deposition (CVD) process and/or an atomic layer deposition (ALD) process and thus may have a relatively small grain size. The gate electrode layer 170 may include, for example, a metal (e.g., tungsten or molybdenum), a metal nitride (e.g., titanium nitride or tantalum nitride), a metal silicide, and/or doped polysilicon. In some embodiments, the gate electrode layer 170 may include substantially the same material as the support gate electrode layer 150, however, the grain size of the gate electrode layer 170 may be smaller than that of the support gate electrode layer 150. In other embodiments, the gate electrode layer 170 may include a different material from that support gate electrode layer 150.

The gate electrode layer 170 may be formed by a CVD process and/or an ALD process that may have gap-filling characteristics greater than that of a PVD process, and thus may be formed not only in a portion of the second recess 130 directly connected to the third recess 160 in a vertical direction substantially perpendicular to an upper surface of the substrate 100 but also in a portion of the second recess 130 adjacent thereto in the first direction D1. Accordingly, the second recess 130 may be entirely filled with the support gate electrode layer 150 and the gate electrode layer 170.

Figure 7:
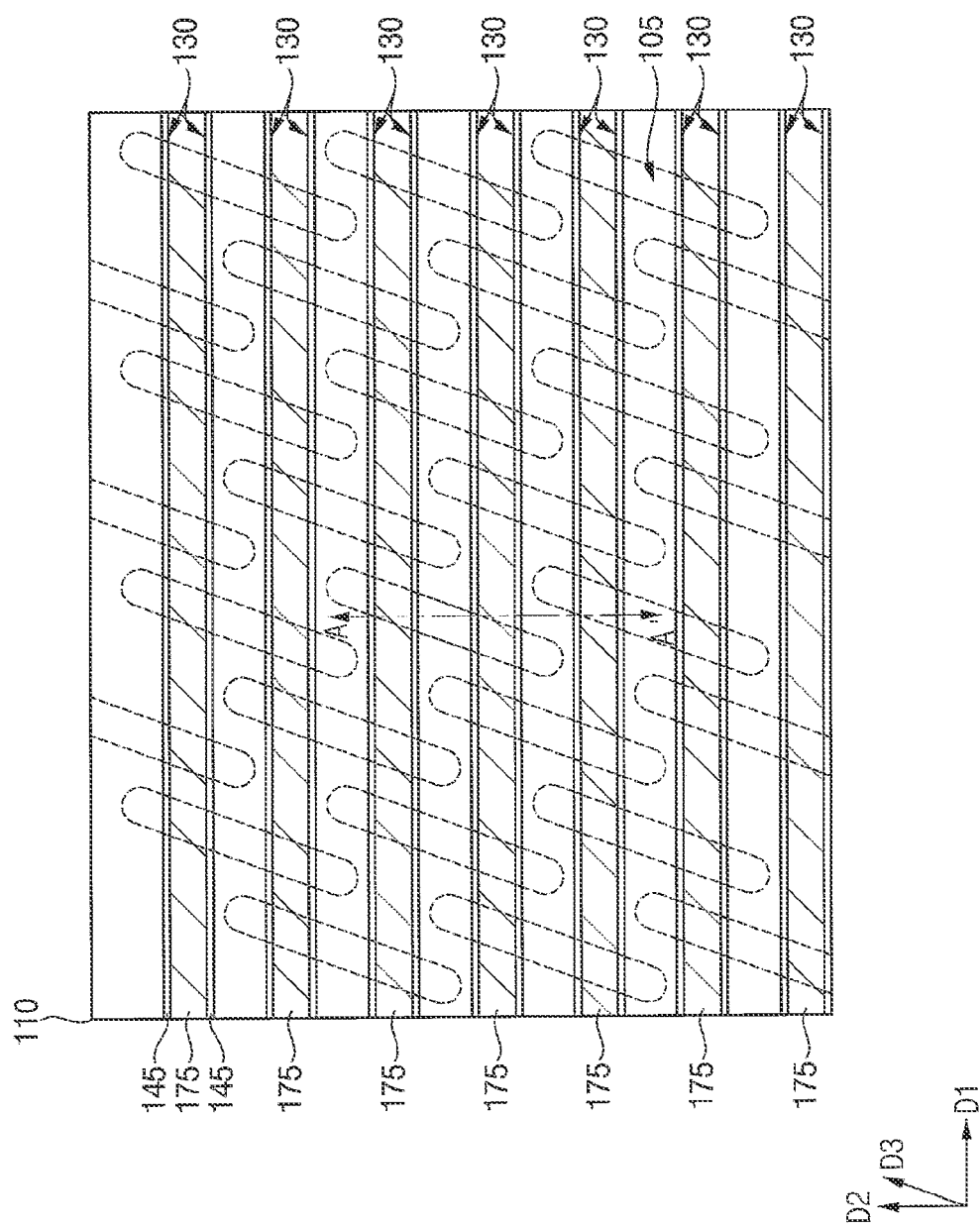
Figure 8:
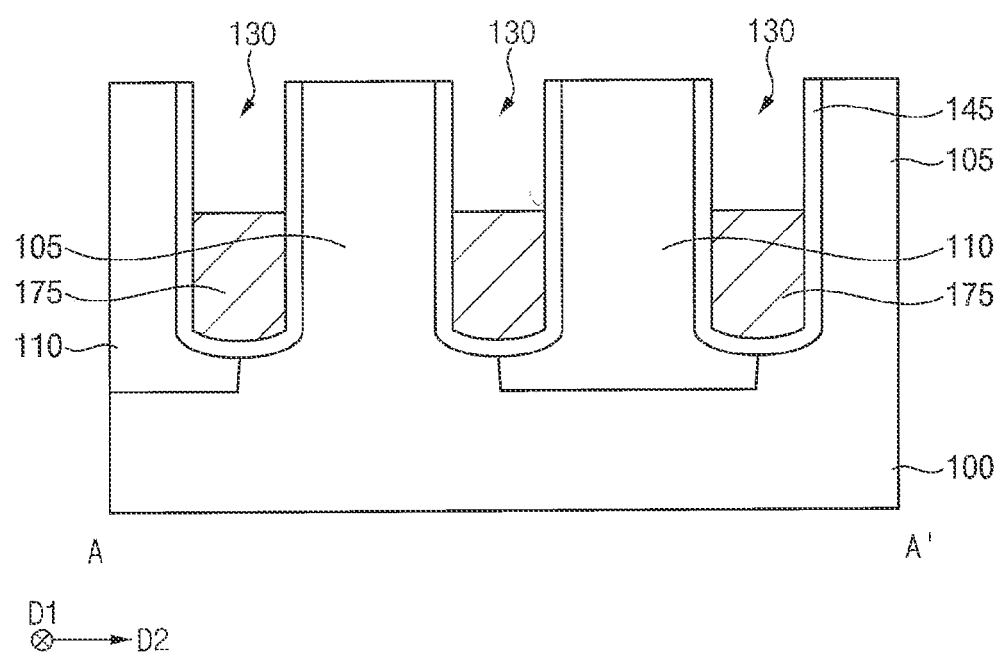

Referring to FIGS. 7 and 8, the gate electrode layer 170, the support gate electrode layer 150, the gate insulation layer 140 and the pad layer 120 may be planarized until upper surfaces of the active pattern 105 and the isolation pattern 110 are exposed.

In example embodiments, the planarization process may include a chemical mechanical polishing (CMP) process. During the planarization process, the pad layer 120 may be entirely removed, and the gate insulation layer 140 may be transformed into a gate insulation pattern 145 covering an inner wall of each of the second recesses 130.

For example, an etch back process may be performed to remove the support gate electrode layer 150 remaining in an upper portion of the second recess 130. During the etch back process, a portion of the gate electrode layer 170 in the upper portion of the second recess 130 may also be removed, and thus the gate electrode layer 170 may remain in a lower portion of each of the second recesses 130 to form a gate electrode 175.

Figure 9:
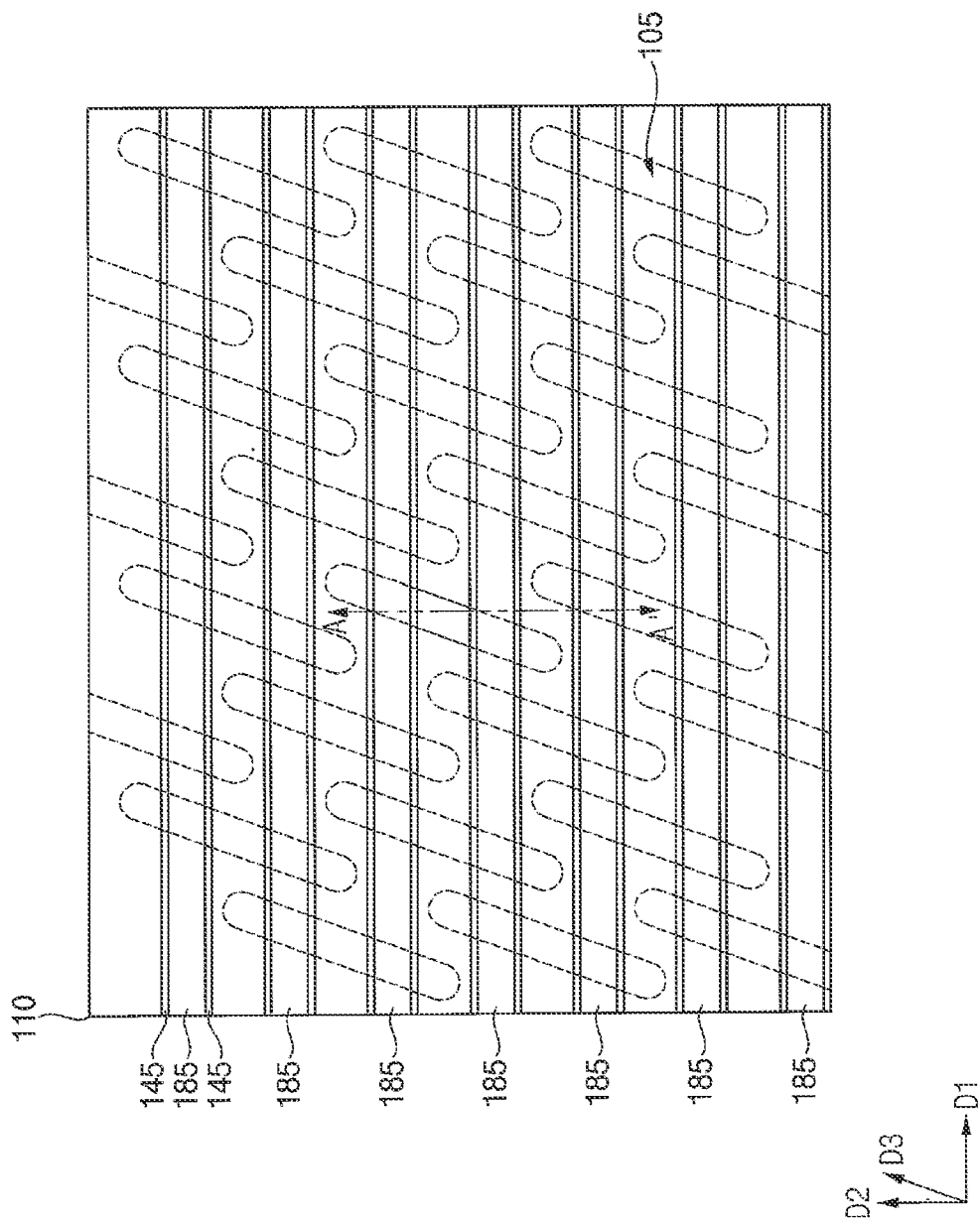
Figure 10:
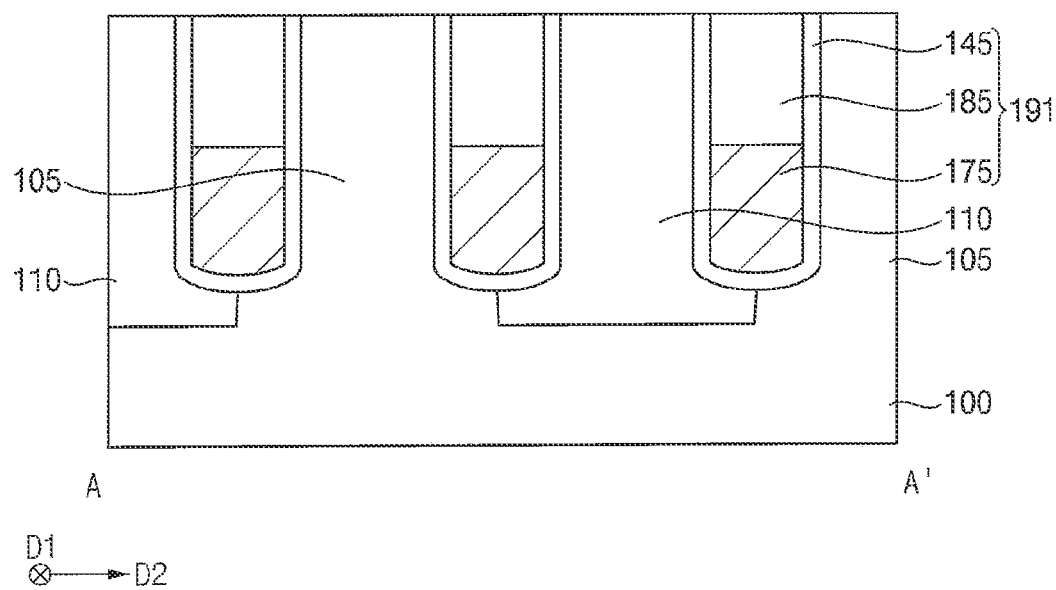

Referring to FIGS. 9 and 10, a gate mask 185 may be formed to fill the upper portion of the second recess 130, which may complete the formation of the gate structure.

In example embodiments, the gate structure may include a gate insulation pattern 145, a gate electrode 175 and a gate mask 185, and a plurality of gate structures each of which may extend in the first direction D1 may be spaced apart from each other in the second direction D2. Hereinafter, the gate structure may be referred to as a first gate structure 191.

The gate mask 185 may be formed by forming a gate mask layer on the active pattern 105, the isolation pattern 110 and the gate insulation pattern 145 to fill the upper portion of the second recess 130 and planarizing the gate mask layer until upper surfaces of the active pattern 105, the isolation pattern 110 and the gate insulation pattern 145 are exposed.

The gate mask 185 may include, for example, a nitride, e.g., silicon nitride.

As illustrated above, after forming the support gate electrode layer 150 on the pad layer 120 to fill an upper portion of each of the second recesses 130, the gate electrode layer 170 may be formed to fill a lower portion of each of the second recesses 130. If the gate electrode layer 170 is formed in each of the second recesses 130 by a CVD process and/or an ALD process, due to compressive or tensile stress applied when the gate electrode layer 170 is deposited or due to Van der Waals force between portions of the gate electrode layer 170 in neighboring second recesses 130, respectively, the pad layer 120, the isolation pattern 110 and the active pattern 105 adjacent to the gate electrode layer 170 may be bent.

However, in example embodiments, the support gate electrode layer 150 may be formed by, e.g., a PVD process to fill an upper portion of each of the second recesses 130 so that the neighboring structures may be supported not to be bent, and the gate electrode layer 170 may be formed by a CVD process and/or an ALD process. Thus, the gate electrode 175 that may be formed in each of the second recesses 130 may not be bent and may have a bar shape straightly extending in the first direction D1.

Figure 11:
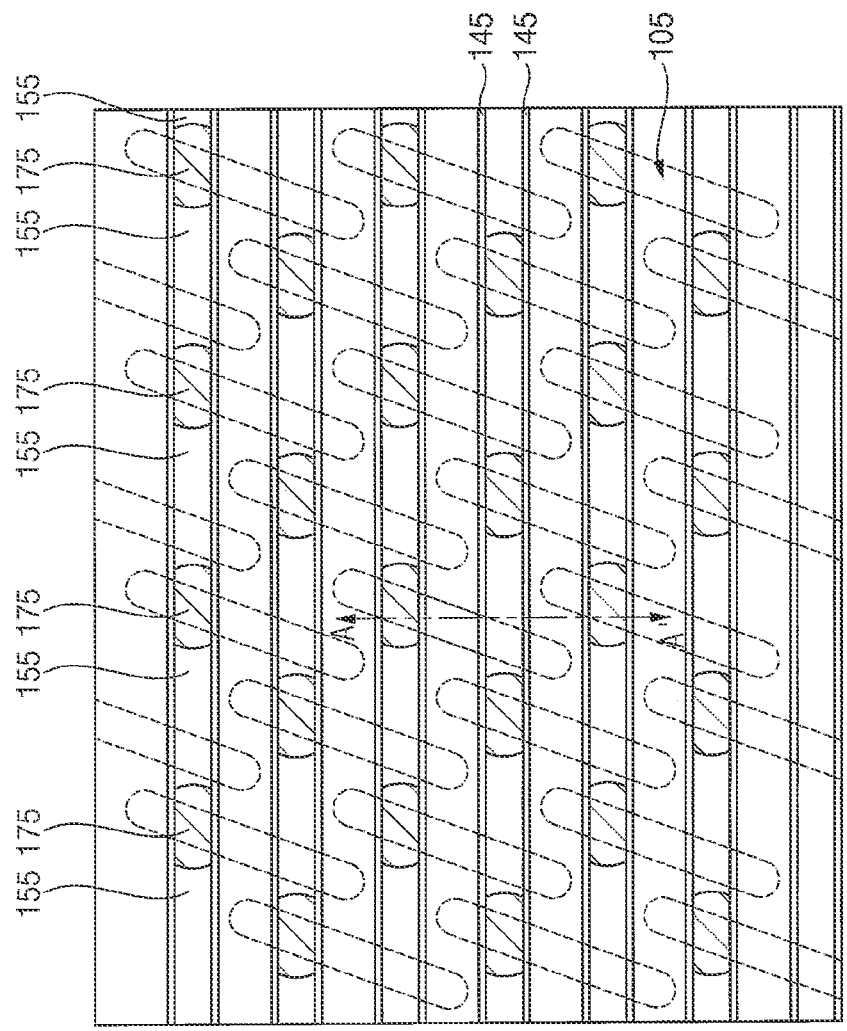
FIGS. 11 and 12 are views illustrating a gate structure in accordance with example embodiments.
Figure 12:
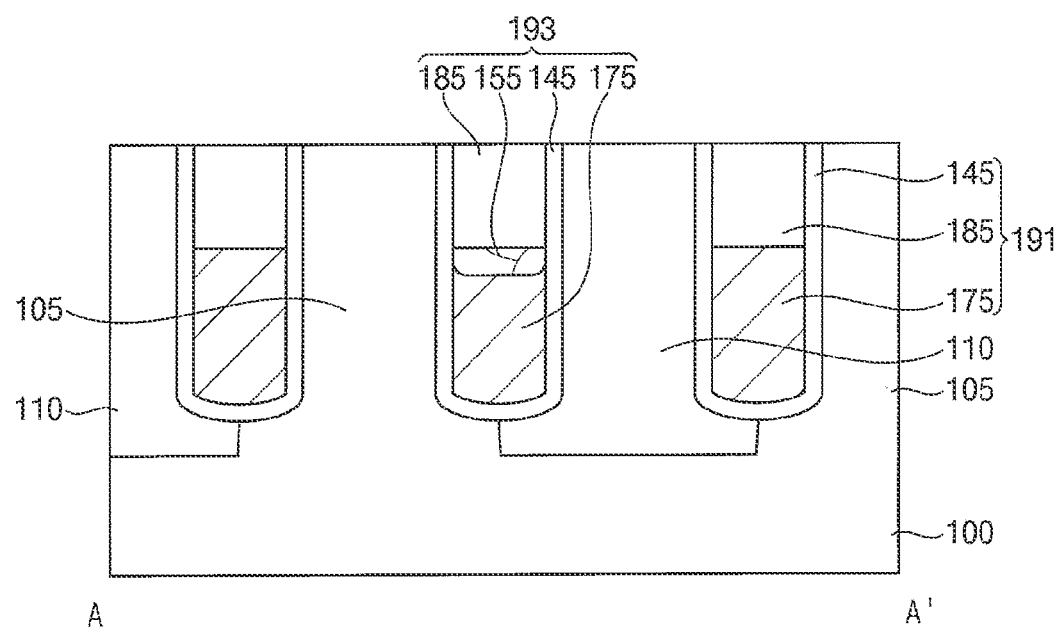

FIGS. 11 and 12 are views illustrating a gate structure in accordance with example embodiments. FIG. 11 is a cross-sectional view of the gate structure taken along a horizontal direction at a height of a support gate electrode 155 shown in FIG. 12.

The gate structure may be substantially the same as or similar to that of FIGS. 9 and 10, except for further including the support gate electrode 155.

Referring to FIGS. 11 and 12, the gate structure may further include the support gate electrode 155 between the gate electrode 175 and the gate mask 185 at a given area.

When the etch back process illustrated with reference to FIGS. 7 and 8 is performed, the support gate electrode layer 150 remaining in an upper portion of the second recess 130 is not entirely removed but partially remain, which may form the support gate electrode 155. Thus, the first gate structure 191 including the gate insulation pattern 145, the gate electrode 175 and the gate mask 185 sequentially stacked may be formed at an area where the third recess 160 is formed, while a second gate structure 193 including the gate insulation pattern 145, the gate electrode 175, the support gate electrode 155 and the gate mask 185 sequentially stacked may be formed at an area where the third recess 160 is not formed. The gate electrode 175 and the support gate electrode 155 may be referred to as first and second gate electrodes 175 and 155, respectively.

In example embodiments, a plurality of first gate structures 191 may be spaced apart from each other in the first direction D1 in each of the second recesses 130, and the second gate structure 193 extending in the first direction D1 to a given length may be formed between neighboring ones of the plurality of first gate structures 191.

The gate structure may have the following structural characteristics.

In example embodiments, the second gate electrode 155 having a grain size greater than that of the first gate electrode 175 extending in the first direction D1 may be formed on a portion of the first gate electrode 175, and a plurality of second gate electrodes 155 may be spaced apart from each other in the first direction D1 on the first gate electrode 175.

In example embodiments, a length in the first direction D1 of an upper surface of each of the second gate electrodes 155 may be greater than that of an upper surface of a portion of the first gate electrode 175 that is between the second gate electrodes 155 not to be covered by the second gate electrodes 155.

In example embodiments, an upper surface of the first gate electrode 175 may be substantially coplanar with an upper surface of the second gate electrode 155. The second gate electrodes 155 may be on first portions of the first gate electrode 175, respectively, and contact the gate mask 185. The first gate electrode 175 may further include second portions contacting the gate mask 185. Each second portion of the first gate electrode 175 may be between two second gate electrodes 155 that are spaced part from each other in the first direction D1. The upper surface of each second portion of the first gate electrode 175 has a first length in the first direction D1, the upper surface of each second gate electrode 155 has a second length in the first direction D1, and the second length may be longer than the first length. An upper surface of the second portion of the first gate electrode 175 and the upper surface of the second gate electrode 155 may be coplanar with each other.

Figure 13:
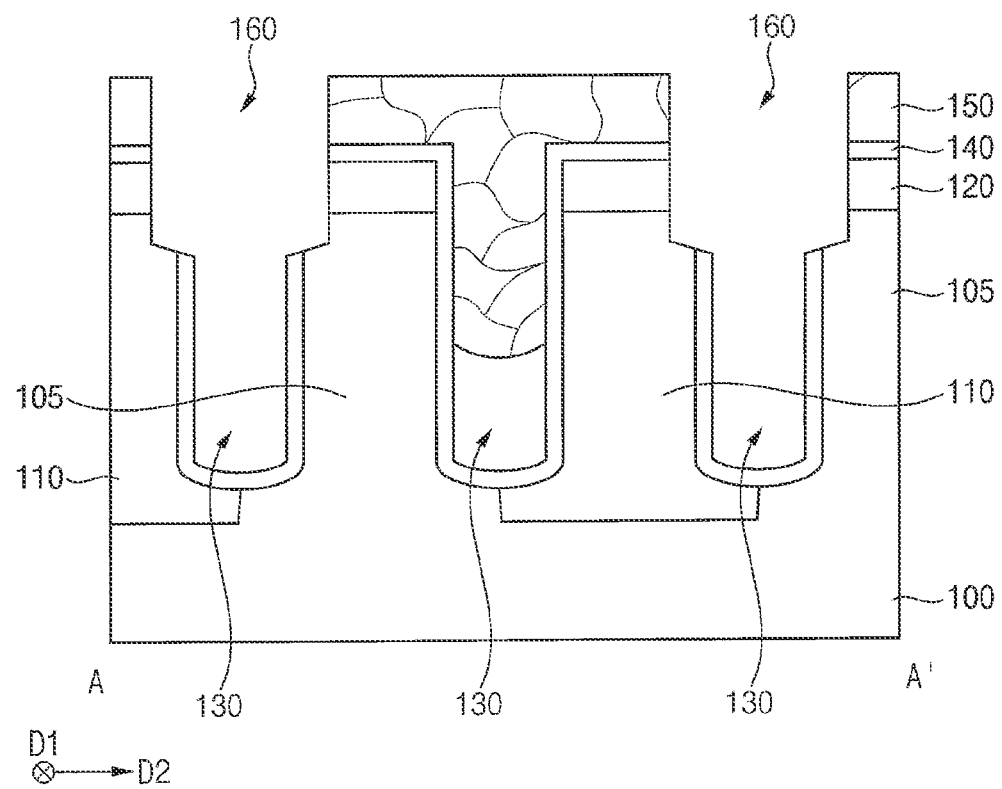
FIGS. 13 to 15 are views illustrating a method of forming a gate structure in accordance with example embodiments.
Figure 14:
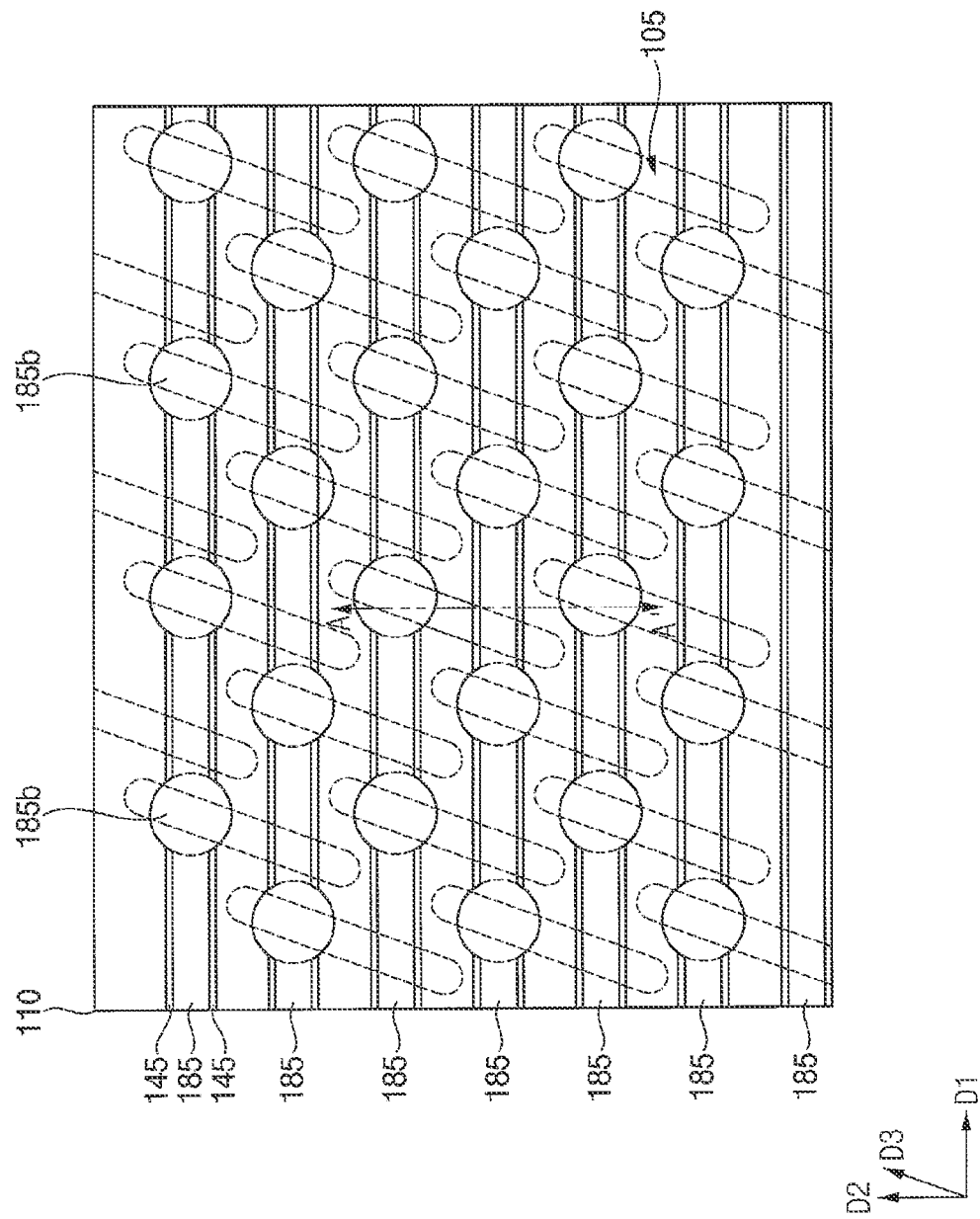
Figure 15:
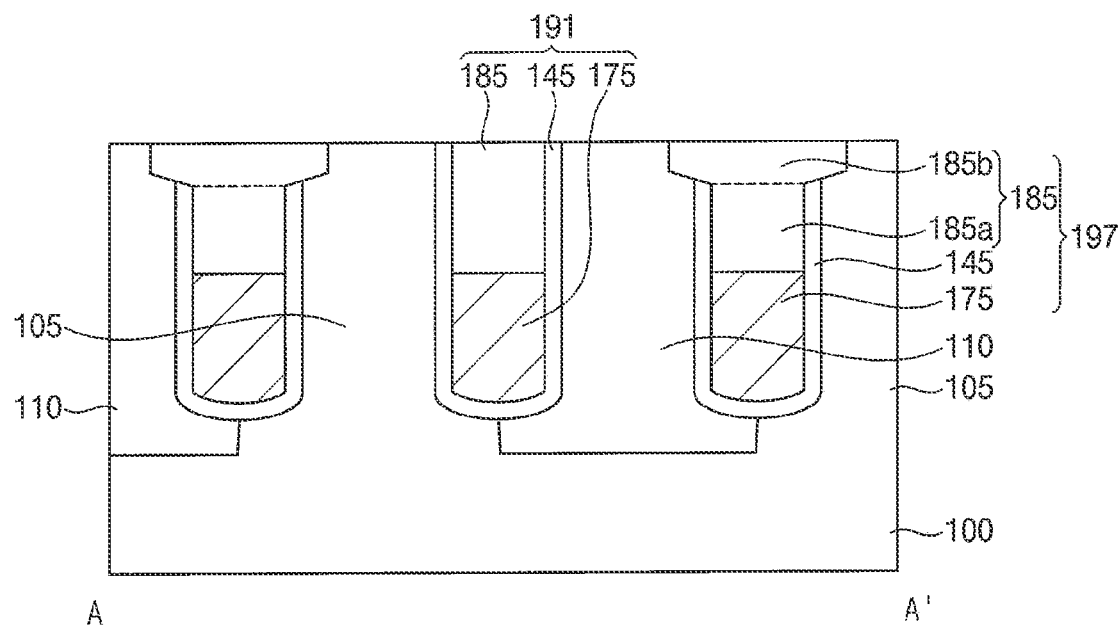

FIGS. 13 to 15 are views illustrating a method of forming a gate structure in accordance with example embodiments. FIG. 14 is a plan view, and FIG. 15 is a cross-sectional view taken along the line A-A' in FIG. 14. FIG. 13 a cross-sectional view corresponding to FIG. 15 before forming gate structures. This method of forming the gate structure may include processes substantially the same as or similar to those illustrated with reference to FIGS. 1 to 10, and thus repeated explanations may be omitted herein.

Referring to FIG. 13, processes substantially the same as or similar to those illustrated with reference to FIGS. 1 to 5 may be performed to form the third recess 160.

However, the third recess 160 may be formed by partially removing not only the support gate electrode layer 150, the gate insulation layer 140 and the pad layer 120 but also upper portions of the active pattern 105 and the isolation pattern 110.

Referring to FIGS. 14 and 15, processes substantially the same as or similar to those illustrated with reference to FIGS. 6 to 10 may be performed to complete the formation of the gate structure.

Thus, the gate mask 185 may have a lower portion 185a having a relatively small width and an upper portion 185b having a relatively large width at an area where the third recess 160 is formed, and a portion of the gate structure including the gate insulation pattern 145, the gate electrode 175, the lower and upper portions 185a and 185b of the gate mask 185 sequentially stacked may be referred to as a third gate structure 197, which may be differentiated from the first gate structure 191. A portion of the gate mask 185 included in the first gate structure 191 may be referred to as a first gate mask, and a portion of the gate mask 185 included in the third gate structure 197 may be referred to as a second gate mask.

In example embodiments, the upper portion 185b of the second gate mask may contact an upper surface of the lower portion 185a of the second gate mask and an uppermost surface of the gate insulation pattern 145, and may have a shape of a circle, ellipse, polygon, polygon with rounded corners, etc., in a plan view.

The gate structure may have following structural characteristics.

In example embodiments, the first gate mask may be formed on a first region of the first gate electrode 175 extending in the first direction D1, and the second gate mask including the lower portion 185a having a first width in the second direction D2 and the upper portion 185b contacting the lower portion 185b and having a second width in the second direction D2 greater than the first width on a second region of the first gate electrode 175.

In example embodiments, the gate insulation pattern 145 may cover a lower surface and a sidewall of the first gate electrode 191, a sidewall of the first gate mask, and a sidewall of the lower portion 185a of the second gate mask, and may contact a portion of a lower surface of the upper portion 185b of the second gate mask.

In example embodiments, a plurality of second gate masks may be spaced apart from each other in the first direction D1 on the first gate electrode 175.

In example embodiments, a length in the first direction D1 of an upper surface of each of the plurality of second gate masks may be less than a length in the first direction D1 of an upper surface of the first gate mask.

In example embodiments, an upper surface of the first gate mask may be substantially coplanar with an upper surface of the upper portion 185b of the second gate mask.

Figure 16:
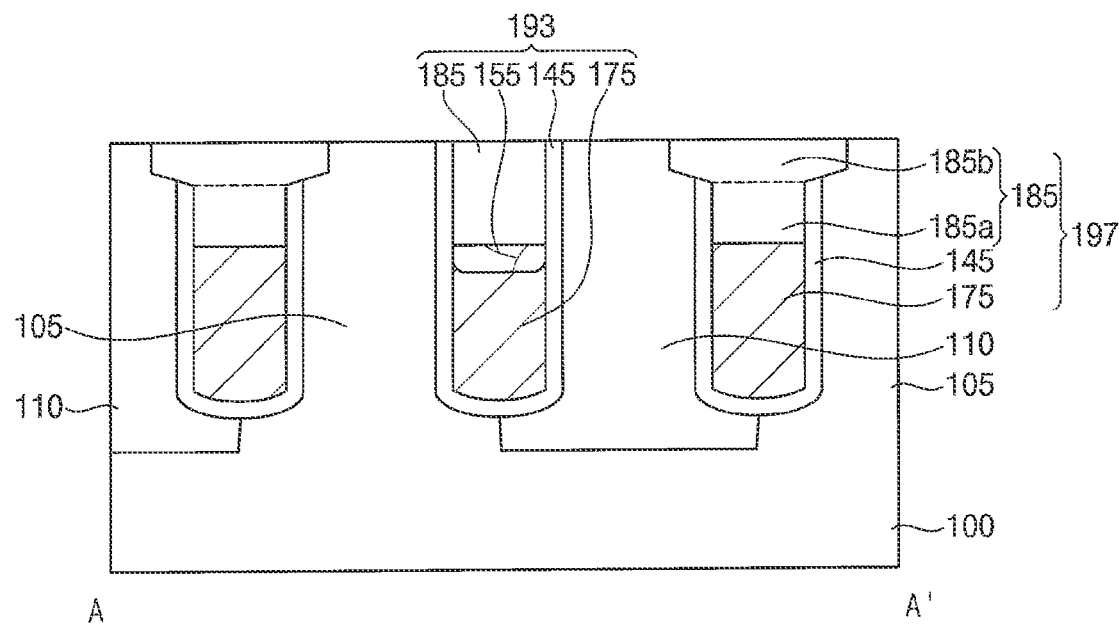
FIG. 16 is a cross-sectional view illustrating a gate structure in accordance with example embodiments.

FIG. 16 is a cross-sectional view illustrating a gate structure in accordance with example embodiments. This gate structure may be substantially the same as or similar to that of FIGS. 14 and 15, except for further including the support gate electrode 155.

Referring to FIG. 16, the gate structure may further include the support gate electrode 155 between the gate electrode 175 and the gate mask 185 at a given area.

As the gate structure shown in FIGS. 11 and 12, instead of the first gate structure 191, the second gate structure 193 including the gate insulation pattern 145, the gate electrode 175, the support gate electrode 155 and the gate mask 185 sequentially stacked may be formed at the area where the third recess 160 is not formed.

In example embodiments, a plurality of third gate structures 197 may be spaced apart from each other in the first direction D1 in each of the second recesses 130, and the second gate structure 193 extending in the first direction D1 to a given length may be formed between neighboring ones of the plurality of third gate structures 197.

Figure 17:
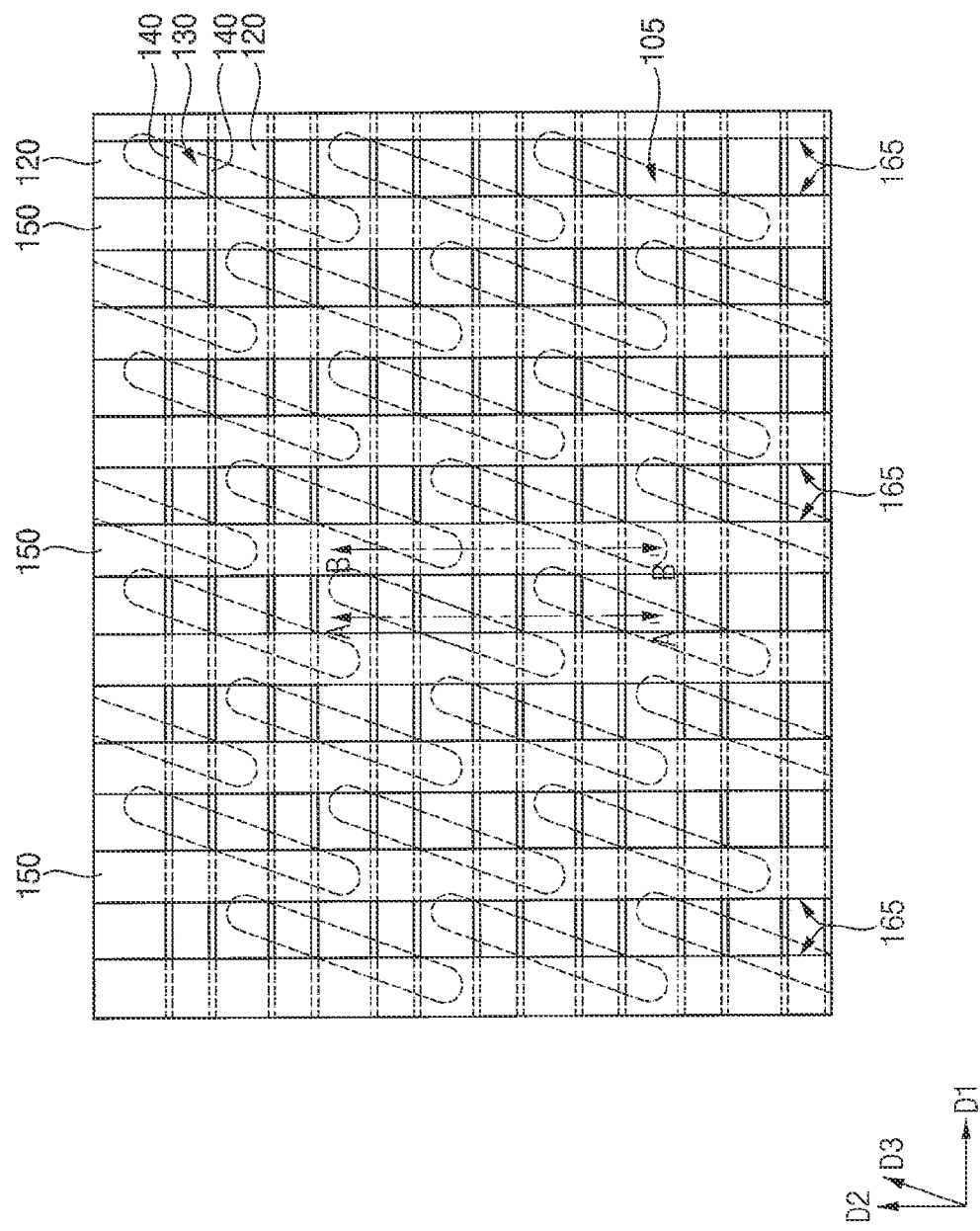
FIGS. 17 to 21 are views illustrating a method of forming a gate structure in accordance with example embodiments.
Figure 18:
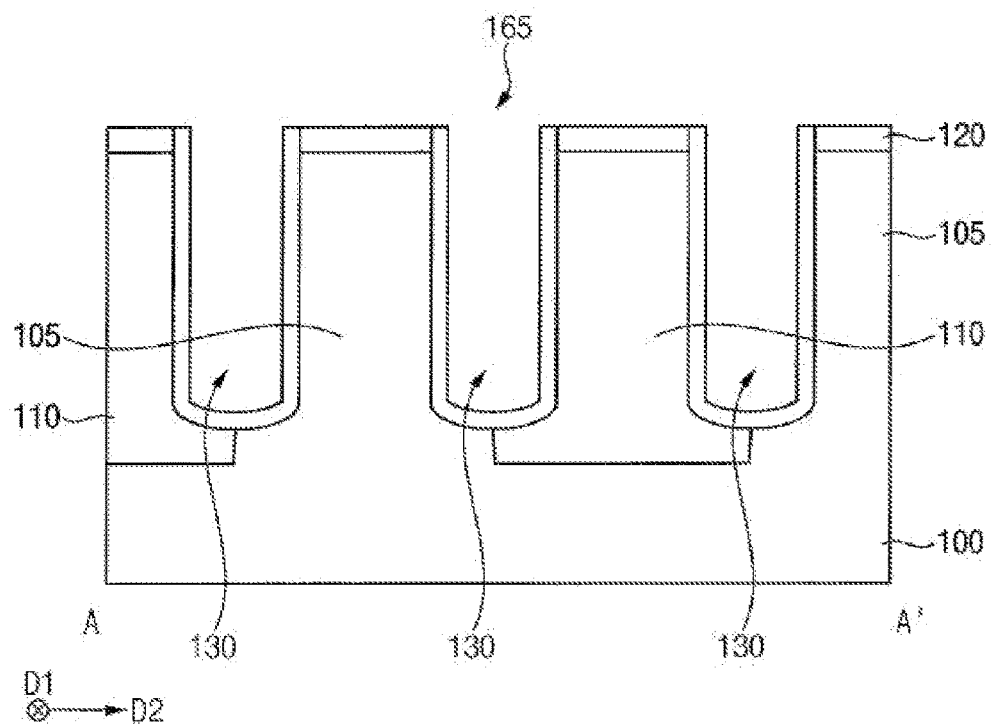
Figure 19:
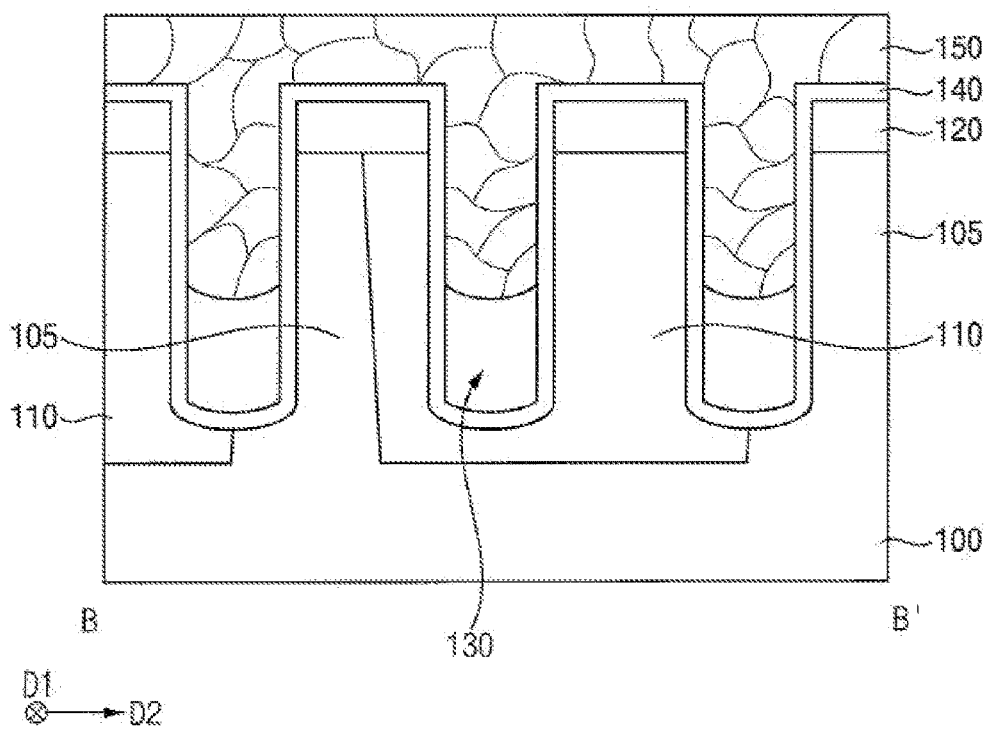
Figure 20:
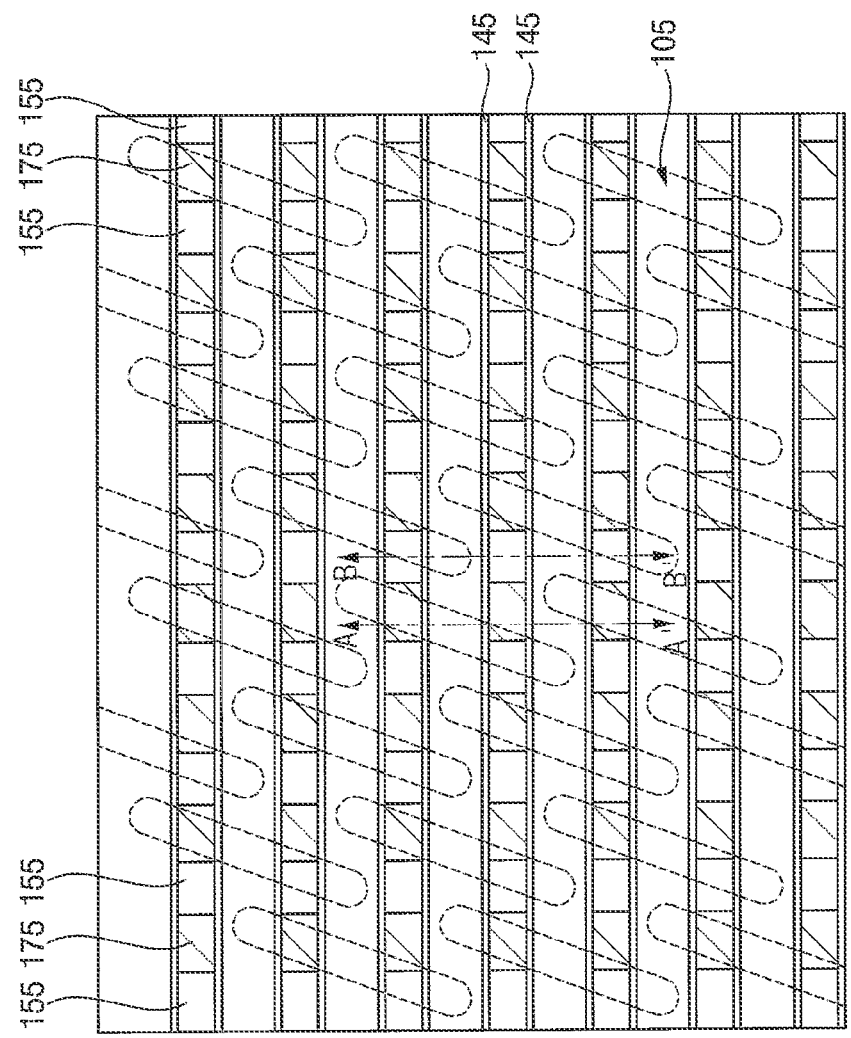
Figure 21:
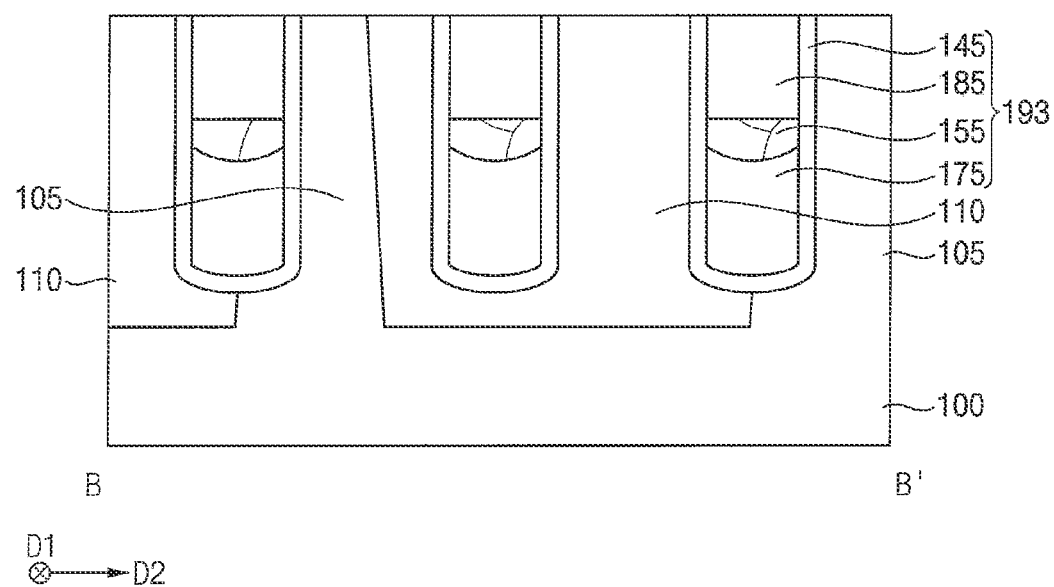

FIGS. 17 to 21 are views illustrating a method of forming a gate structure in accordance with example embodiments. FIGS. 17 and 20 are the plan views, FIG. 18 is a cross-sectional view taken along a line A-A' of a corresponding plan view, and FIGS. 19 and 21 are cross-sectional views taken along lines B-B' of corresponding plan views, respectively. This method of forming the gate structure may processes substantially the same as or similar to those illustrated with reference to FIGS. 1 to 10, and repeated explanations are omitted herein.

Referring to FIGS. 17 to 19, processes substantially the same as or similar to those illustrated with reference to FIGS. 1 to 5 may be performed so that upper portions of the support gate electrode layer 150, the gate insulation layer 140 and the pad layer 120 may be partially removed to form a fourth recess 165.

The fourth recess 165 may expose a portion of the support gate electrode layer 150 in the second recess 130. In example embodiments, the fourth recess 165 may extend in the second direction D2, and a plurality of fourth recesses 165 may be spaced apart from each other in the first direction D1.

In an example embodiment, the fourth recess 165 may have a width in the first direction D1 that may not be constant but varies along the second direction D2. For example, a width of a portion of the fourth recess 165 at an area where the support gate electrode layer 150 is formed may be greater than a width of a portion of the fourth recess 165 at an area where the pad layer 120 is formed. In an example embodiment, a depth of the portion of the fourth recess 165 at the area where the support gate electrode layer 150 is formed may be greater than a depth of the portion of the fourth recess 165 at the area where the pad layer 120 is formed.

A portion of the support gate electrode layer 150 remaining in each of the second recesses 130 exposed by the fourth recess 165 may be removed so that the fourth recess 165 may be connected with the second recess 130.

However, a portion of the support gate electrode layer 150 not overlapping the fourth recess 165 in the vertical direction may remain. As used herein, "an element A overlapping an element B in a direction X" (or similar language) means that there is at least one line that extends in the direction X and intersects both the elements A and B.

Processes substantially the same as or similar to those illustrated with reference to FIGS. 6 to 10 may be performed to complete the formation of the gate structure, which may have the same shape as the gate structure shown in FIGS. 9 and 10.

FIGS. 20 and 21 are a horizontal cross-sectional view and a vertical cross-sectional view, respectively, illustrating a gate structure in accordance with example embodiments. FIG. 20 is a horizontal cross-section view taken along the horizontal direction at a height of the support gate electrode 155.

This gate structure may be substantially the same as or similar to that of FIGS. 9 and 10, except for further including the support gate electrode 155.

Referring to FIGS. 20 and 21, the gate structure may further include the support gate electrode 155 between the gate electrode 175 and the gate mask 185 at a given area.

Particularly, processes substantially the same as or similar to those illustrated with reference to FIGS. 17 to 19 may be performed to form the fourth recess 165 extending in the first direction D1, processes substantially the same as or similar to those illustrated with reference to FIG. 6 may be performed to form the gate electrode layer 170, and processes substantially the same as or similar to those illustrated with reference to FIGS. 7 and 8 may be performed. When the etch back process is performed, the portion of the support gate electrode 150 in the upper portion of the second recess 130 may not be entirely removed but partially remain, which may form the support gate electrode 155.

Thus, the first gate structure 191 including the gate insulation pattern 145, the gate electrode 175 and the gate mask 185 sequentially stacked may be formed at an area where the fourth recess 165 is formed, while the second gate structure 193 including the gate insulation pattern 145, the gate electrode 175, the support gate electrode 155 and the gate mask 185 sequentially stacked may be formed at an area where the fourth recess 165 is not formed.

In example embodiments, the first and third gate structures 191 and 193 may be alternately and repeatedly formed in the first direction D1 in each of the second recesses 130.

FIGS. 22 to 36 are views illustrating a method of manufacturing a semiconductor device in accordance with example embodiments. Particularly, FIGS. 22, 25, 29, 32 and 34 are the plan views, and each of FIGS. 23-24, 26-28, 30-31, 33 and 35-36 includes cross-sectional views taken along lines C-C' and D-D' of a corresponding plan view.

This method of manufacturing the semiconductor device is the application of the method of forming the gate structure illustrated with reference to FIGS. 1 to 10 to a method of DRAM device. Thus, repeated explanations on the formation of the gate structure may be omitted herein.

However, the method of forming the gate structure illustrated with reference to FIGS. 11 to 21 and the gate structure formed by the above method may also be applied to the method of manufacturing the DRAM device and the DRAM device manufactured by the method.

Figure 22:
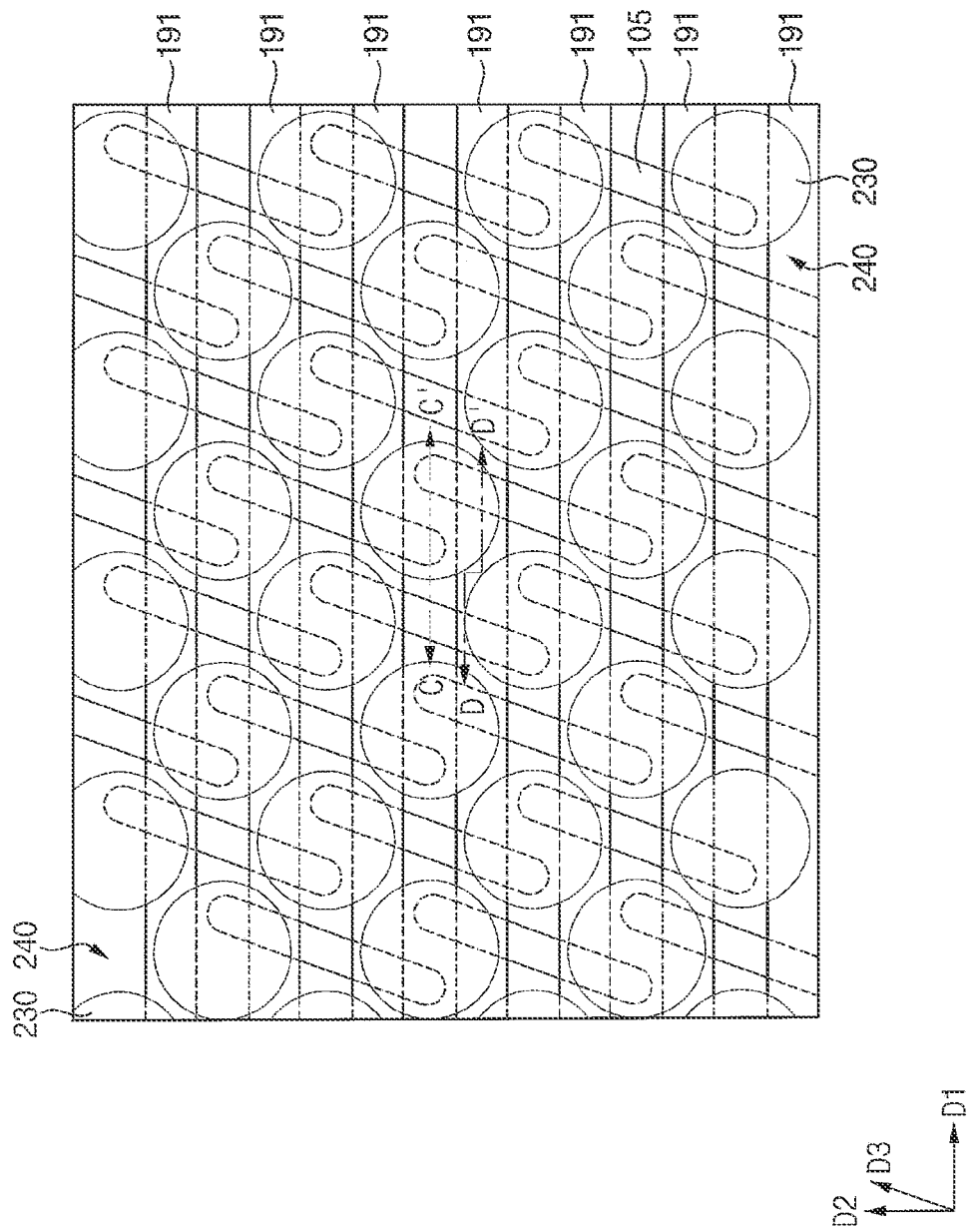
Figure 23:
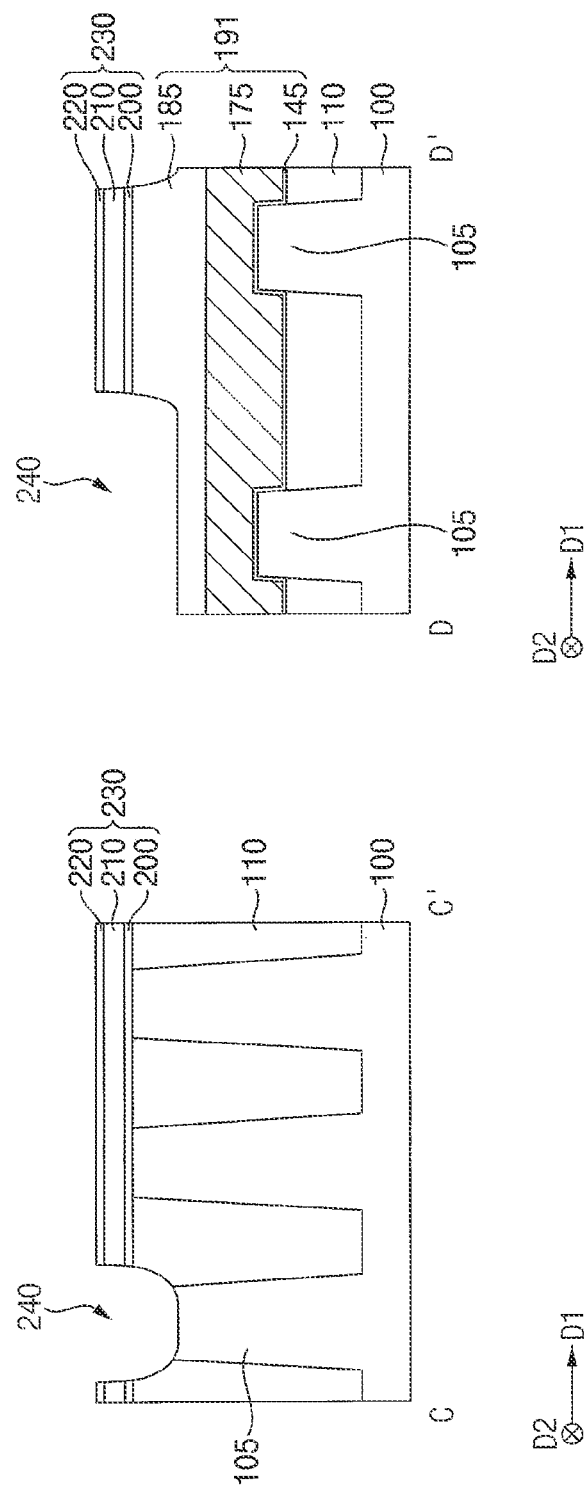

Referring to FIGS. 22 and 23, processes substantially the same as or similar to those illustrated with reference to FIGS. 1 to 10 may be performed to form the first gate structure 191.

An insulation layer structure 230 may be formed on the active pattern 105, the isolation pattern 110 and the first gate structure 191. The insulation layer structure 230 may include first, second and third insulation layers 200, 210 and 220 sequentially stacked. For example, the first and third insulation layers 200 and 220 may include an oxide, e.g., silicon oxide, and the second insulation layer 210 may include a nitride, e.g., silicon nitride.

The insulation layer structure 230 may be patterned, and the active pattern 105, the isolation pattern 110 and the gate mask 185 included in the first gate structure 191 may be partially etched using the patterned insulation layer structure 230 as an etching mask to form a first opening 240. In example embodiments, the insulation layer structure 230 remaining after the etching process may have a shape of a circle or ellipse in a plan view, and a plurality of insulation layer structures 230 may be spaced apart from each other in the first and second directions D1 and D2. Each of the insulation layer structures 230 may overlap ends in the third direction D3 of neighboring ones of the active patterns 105 in a vertical direction substantially perpendicular to an upper surface of the substrate 100.

Figure 24:
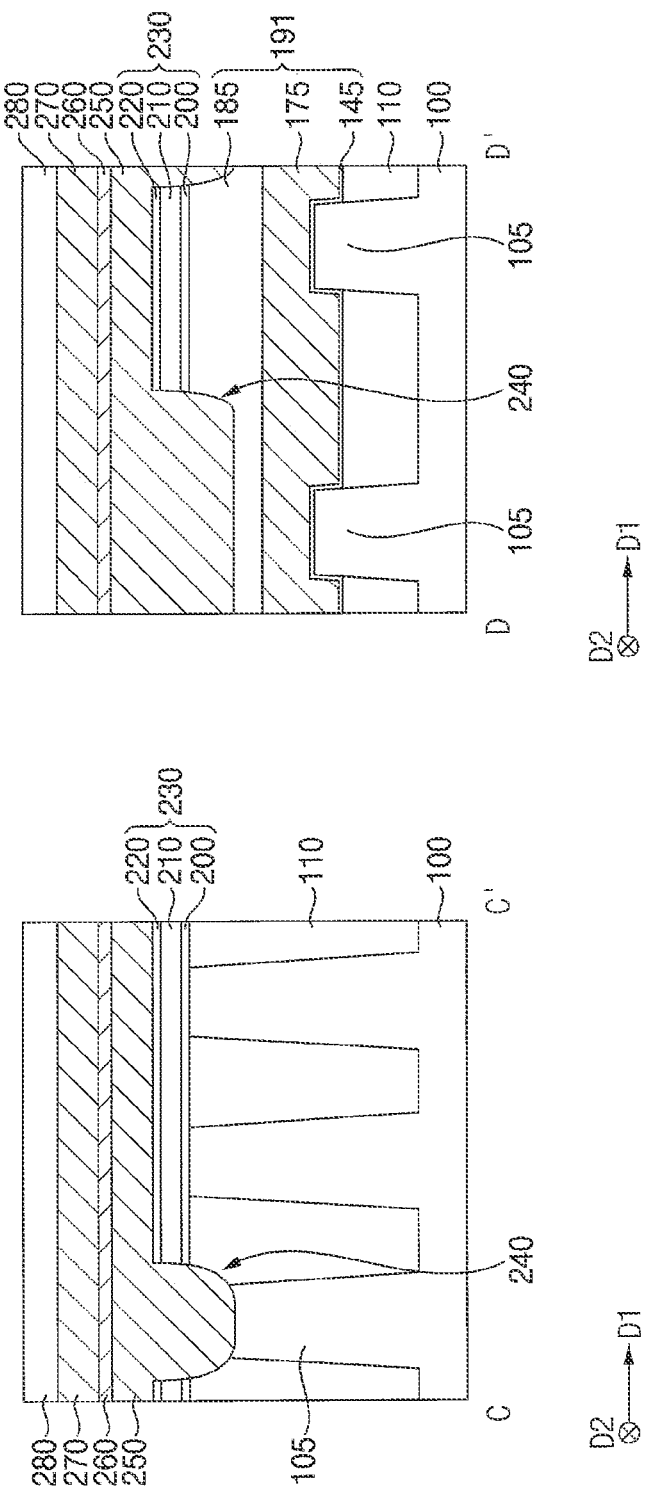

Referring to FIG. 24, a first conductive layer 250, a first barrier layer 260, a second conductive layer 270 and a first mask layer 280 may be sequentially stacked on the insulation layer structure 230, the active pattern 105 exposed by the first opening 240, the isolation pattern 110 and the first gate structure 191, which may form a conductive layer structure. The first conductive layer 250 may fill the first opening 240.

For example, the first conductive layer 250 may include, e.g., doped polysilicon, the first barrier layer 260 may include a metal silicon nitride, e.g., titanium silicon nitride, the second conductive layer 270 may include a metal, e.g., tungsten, and the first mask layer 280 may include a nitride, e.g., silicon nitride.

Figure 25:
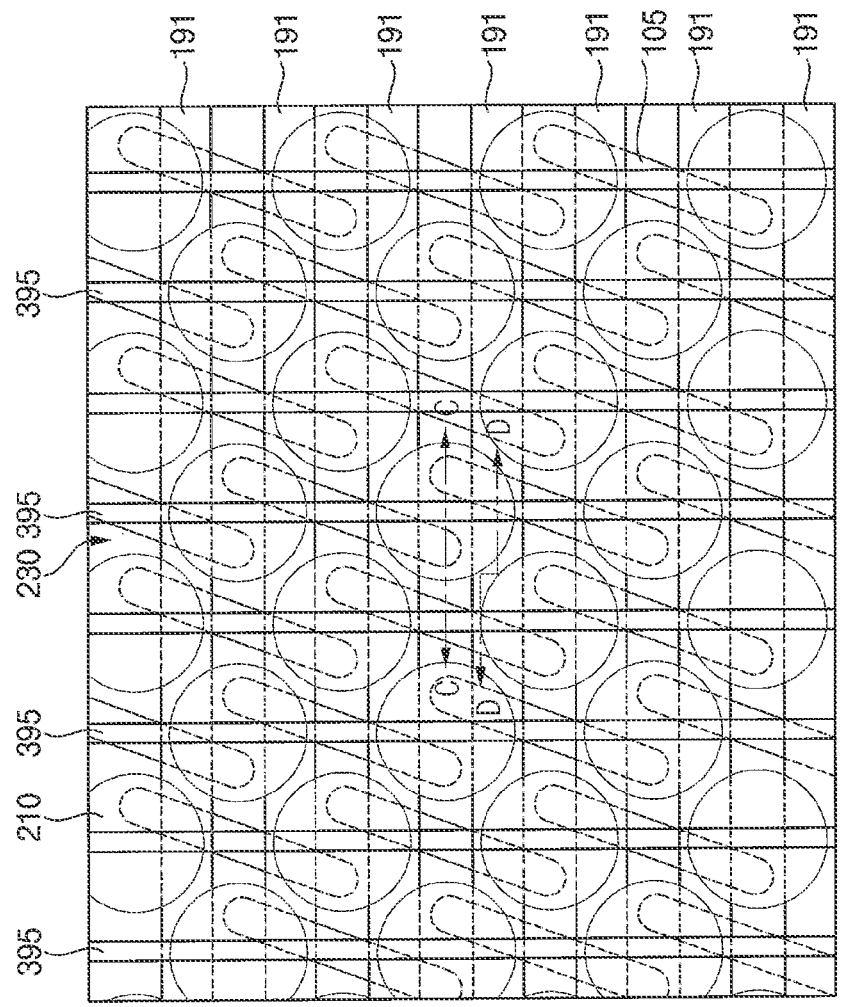
Figure 26:
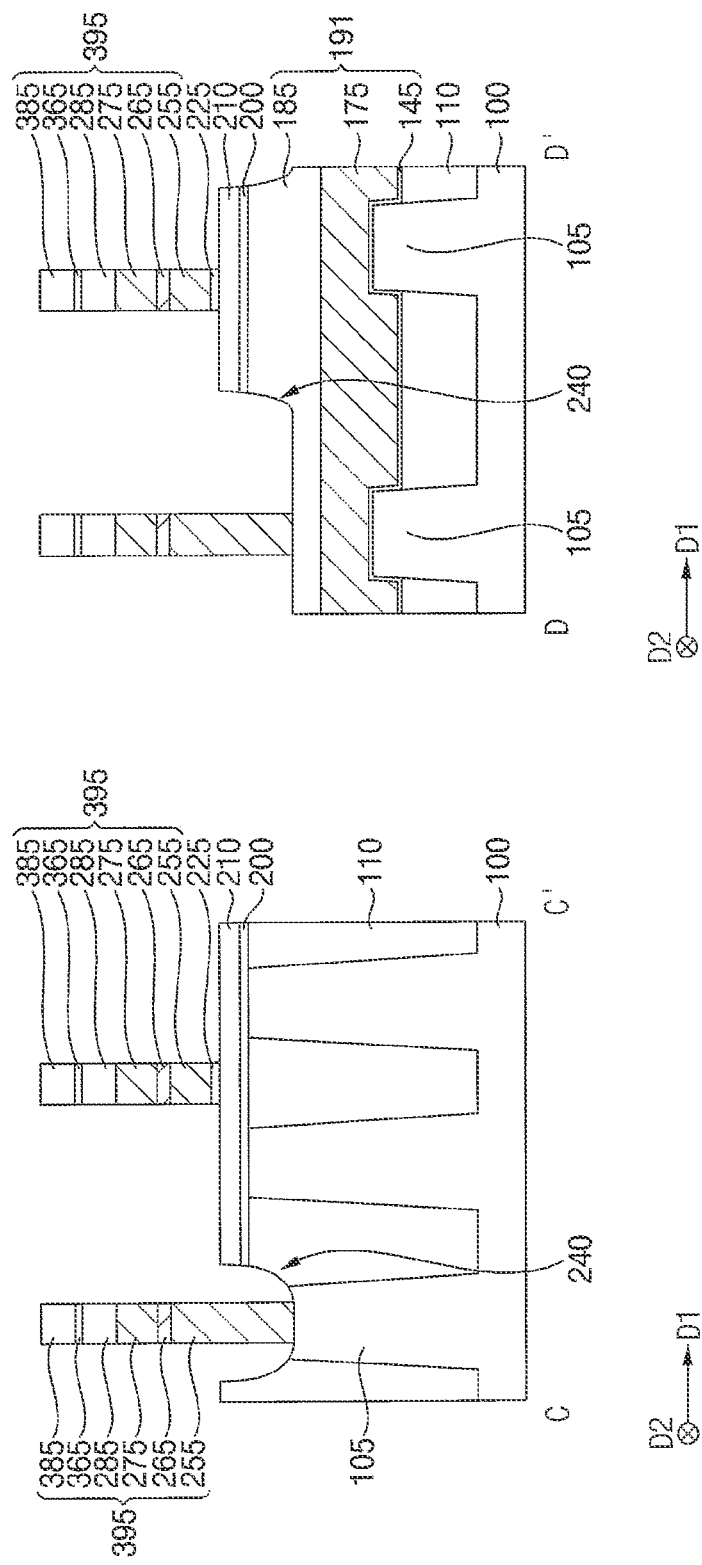

Referring to FIGS. 25 and 26, a first etch stop layer and a first capping layer may be sequentially stacked on the conductive layer structure, the first capping layer may be etched to form a first capping pattern 385, and the first etch stop layer, the first mask layer 280, the second conductive layer 270, the first barrier layer 260 and the first conductive layer 250 may be sequentially etched using the first capping pattern 385 as an etching mask.

In example embodiments, the first capping pattern 385 may extend in the second direction D2, and a plurality of first capping patterns 385 may be spaced apart from each other in the first direction D1.

By the etching process, a first conductive pattern 255, a first barrier pattern 265, a second conductive pattern 275, a first mask 285, a first etch stop pattern 365 and the first capping pattern 385 may be sequentially stacked on the first opening 240, and a third insulation pattern 225, the first conductive pattern 255, the first barrier pattern 265, the second conductive pattern 275, the first mask 285, the first etch stop pattern 365 and the first capping pattern 385 may be sequentially stacked on the second insulation layer 210 of the insulation layer structure 230 at an outside of the first opening 240.

Hereinafter, the first conductive pattern 255, the first barrier pattern 265, the second conductive pattern 275, the first mask 285, the first etch stop pattern 365 and the first capping pattern 385 sequentially stacked may be referred to as a bit line structure 395. In example embodiments, the bit line structure 395 may extend in the second direction D2 on the substrate 100, and a plurality of bit line structures 395 may be spaced apart from each other in the first direction D1.

Figure 27:
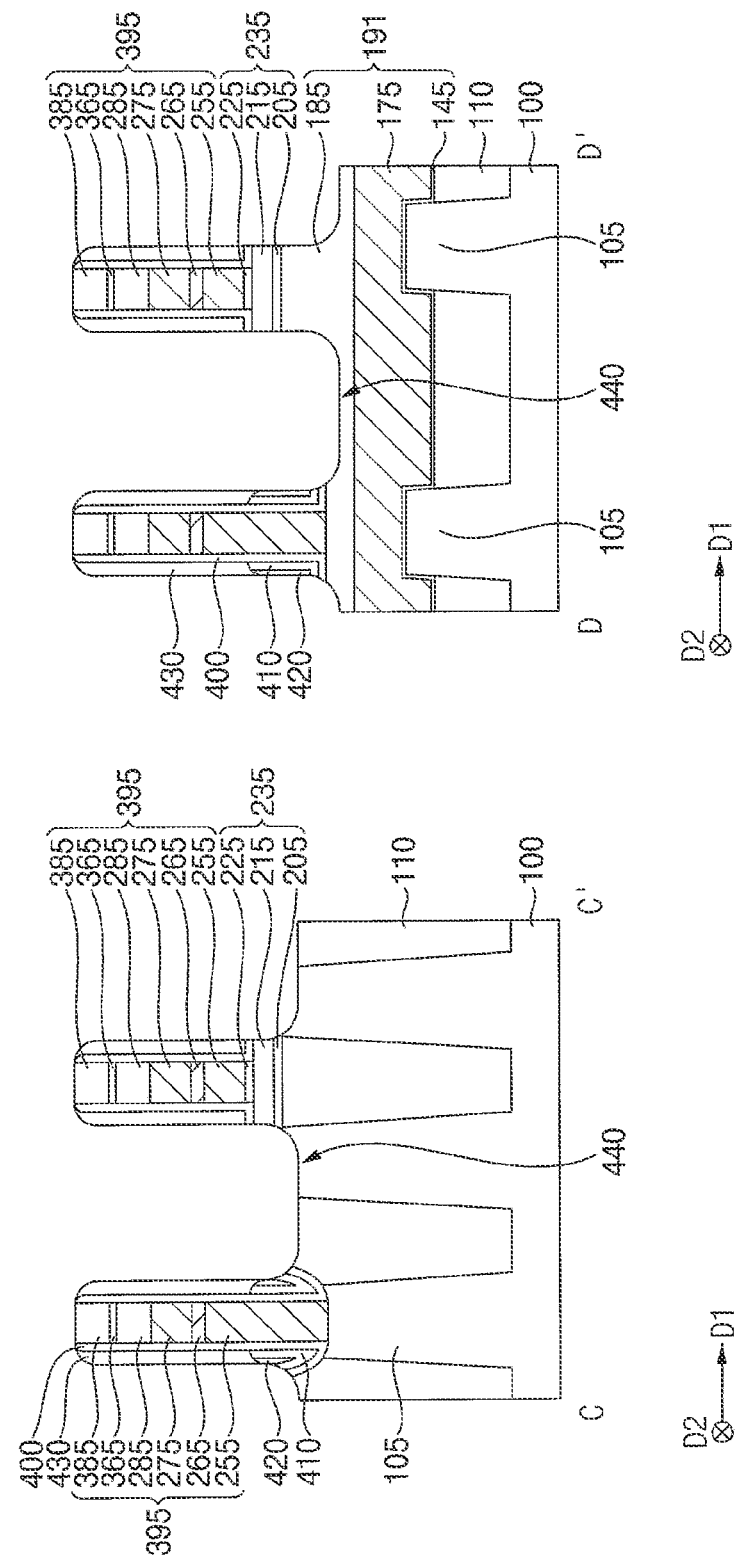

Referring to FIG. 27, a first spacer layer may be formed on the substrate 100 having the bit line structure 395 thereon, and fourth and fifth insulation layers may be sequentially formed on the first spacer layer.

The first spacer layer may also cover a sidewall of the third insulation pattern 225 under a portion of the bit line structure 395 on the second insulation layer 210, and the fifth insulation layer may fill a remaining portion of the first opening 240.

For example, the first spacer layer may include a nitride, e.g., silicon nitride, the fourth insulation layer may include an oxide, e.g., silicon oxide, and the fifth insulation layer may include a nitride, e.g., silicon nitride.

The fourth and fifth insulation layers may be etched by an etching process. In example embodiments, the etching process may be performed by a wet etching process using phosphoric acid, SC1 and hydrofluoric acid as an etching solution, and other portions of the fourth and fifth insulation layers except for portions of the fourth and fifth insulation layers in the first opening 240 may be removed. Thus, most portion of a surface of the first spacer layer, that is, other portions of the first spacer layer except for the portion thereof in the first opening 240 may be exposed, and the portions of the fourth and fifth insulation layers remaining in the first opening 240 may form fourth and fifth insulation patterns 410 and 420, respectively.

A second spacer layer may be formed on the exposed surface of the first pacer layer and the fourth and fifth insulation patterns 410 and 420 in the first opening 240, and may be anisotropically etched to form a second spacer 430 on the surface of the first spacer layer and the fourth and fifth insulation patterns 410 and 420 to cover a sidewall of the bit line structure 395. For example, the second spacer layer may include an oxide, e.g., silicon oxide.

A dry etching process may be performed using the first capping pattern 385 and the second spacer 430 as an etching mask to form a second opening 440 exposing an upper surface of the active pattern 105, and upper surfaces of the isolation pattern 110 and the gate mask 185 may also be exposed by the second opening 440.

By the dry etching process, a portion of the first spacer layer on the upper surfaces of the first capping pattern 385 and the second insulation layer 210 may be removed, and thus a first spacer 400 may be formed to cover the sidewall of the bit line structure 395. Additionally, during the dry etching process, the first and second insulation layers 200 and 210 may be partially removed, and first and second insulation patterns 205 and 215 may remain under the bit line structure 395. The first to third insulation patterns 205, 215 and 225 sequentially stacked under the bit line structure 395 may form an insulation pattern structure.

Figure 28:
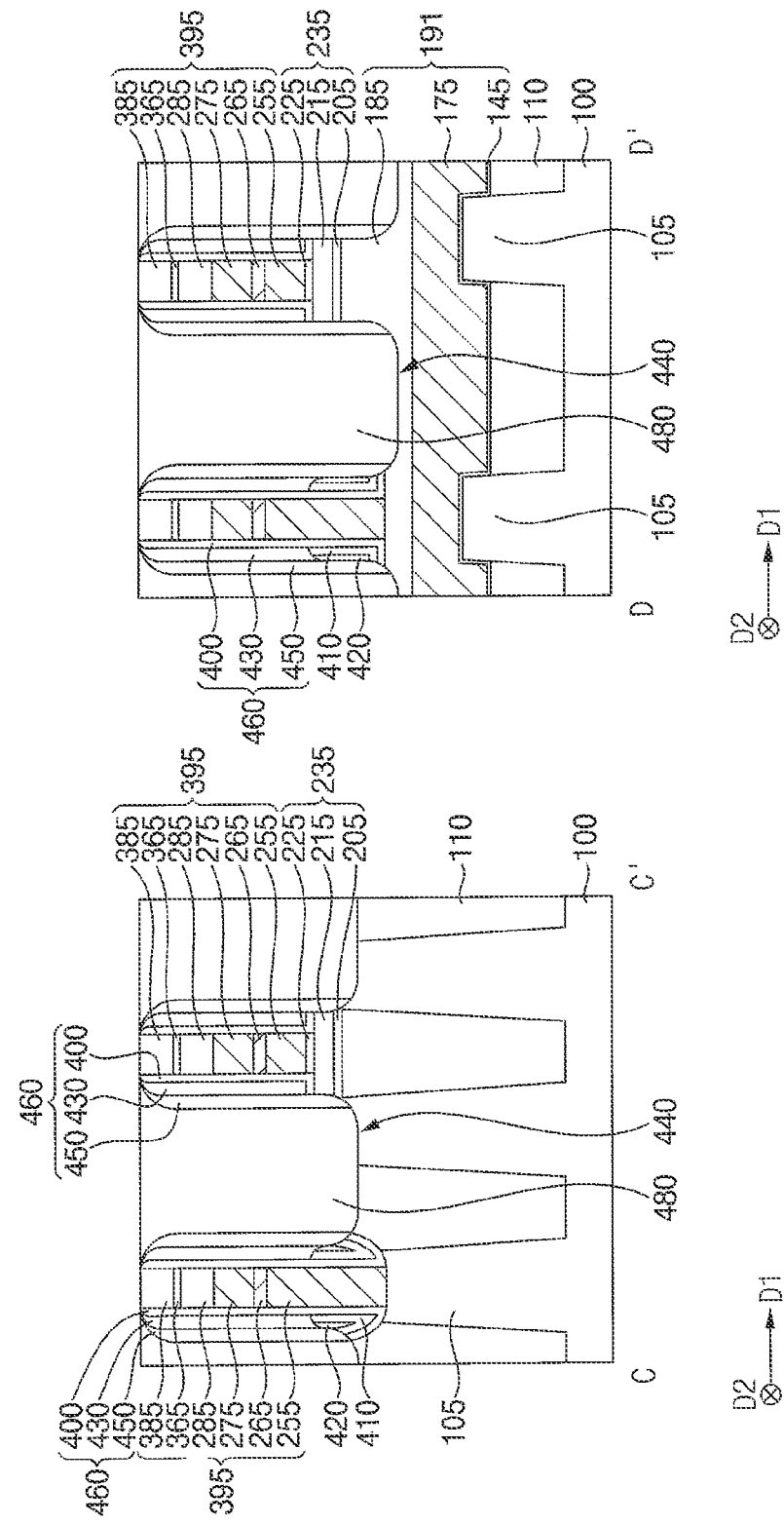

Referring to FIG. 28, a third spacer layer may be formed on the upper surface of the first capping pattern 385, an outer sidewall of the second spacer 430, portions of the upper surfaces of the fourth and fifth insulation patterns 410 and 420, and upper surfaces of the active pattern 105, the isolation pattern 110 and the gate mask 185 exposed by the second opening 440, and may be anisotropically etched to form a third spacer 450 covering the sidewall of the bit line structure 395. For example, the third spacer layer may include a nitride, e.g., silicon nitride.

The first to third spacers 400, 430 and 450 sequentially stacked on the sidewall of the bit line structure 395 in a horizontal direction substantially parallel to the upper surface of the substrate 100 may be referred to as a preliminary spacer structure 460.

A second capping pattern 480 may be formed on the substrate 100 to fill the second opening 440 and may be planarized until the upper surface of the first capping pattern 385 is exposed. In example embodiments, the second capping pattern 480 may extend in the second direction D2, and a plurality of second capping patterns 480 may be spaced apart from each other in the first direction D1. For example, the second capping pattern 480 may include a nitride, e.g., silicon nitride.

Figure 29:
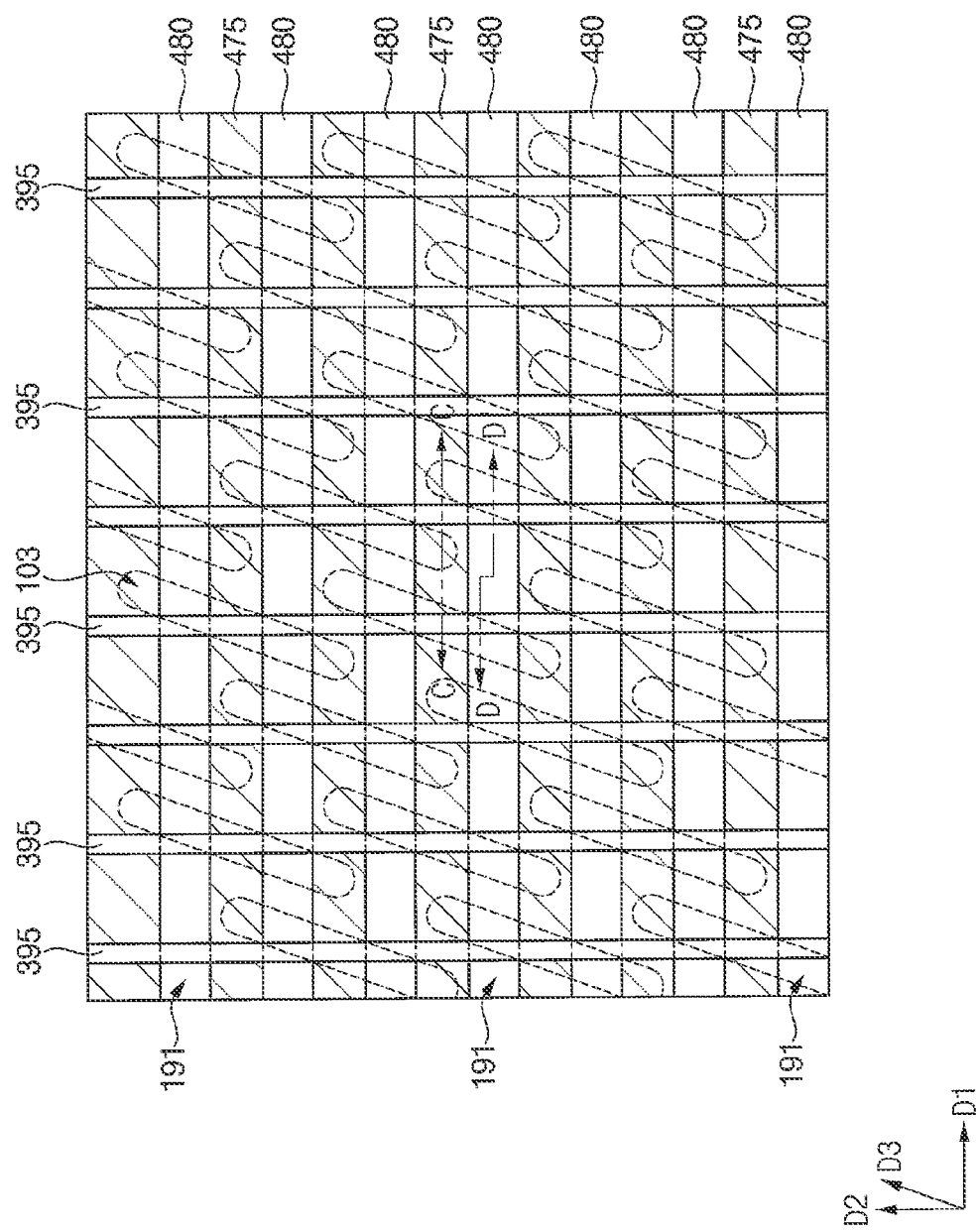
Figure 30:
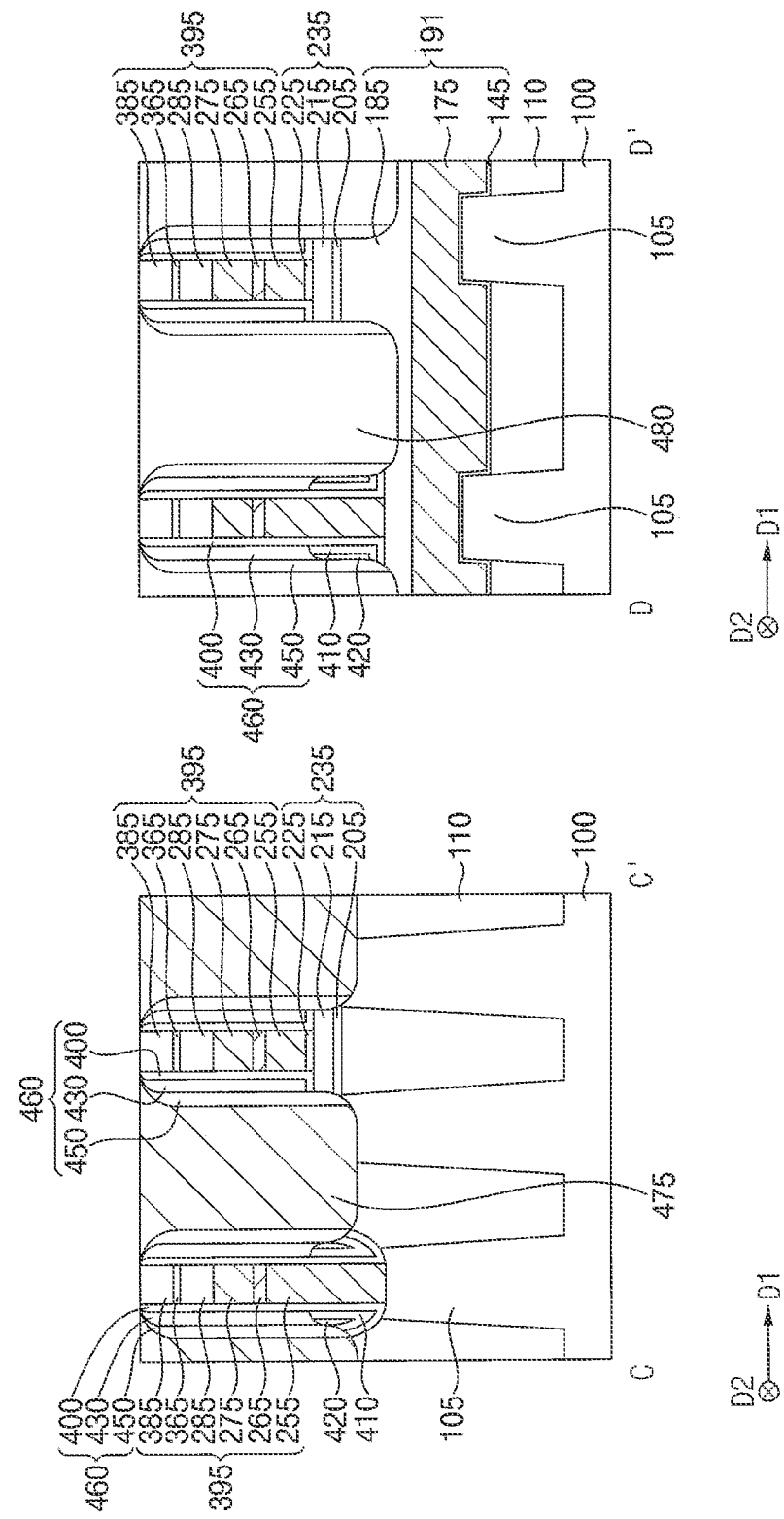

Referring to FIGS. 29 and 30, a second mask (not shown) having a plurality of third openings spaced apart from each other in the second direction D2, each of which may extend in the first direction D1, may be formed on the first and second capping patterns 385 and 480, and the second capping pattern 480 may be etched using the second mask as an etching mask.

In example embodiments, each of the third openings may overlap the first gate structure 191 in the vertical direction. By the etching process, a fourth opening exposing an upper surface of the gate mask 185 of the first gate structure 191 may be formed between the bit line structures 395.

After removing the second mask, a lower contact plug layer may be formed to fill the fourth opening, and may be planarized until the upper surfaces of the first and second capping patterns 385 and 480 are exposed. Thus, the lower contact plug layer may be divided into a plurality of lower contact plugs 475 spaced apart from each other in the second direction D2, each of which may extend in the first direction D1 between the bit line structures 395. Additionally, the second capping pattern 480 extending in the second direction D2 between the bit line structures 395 may be divided into a plurality of parts spaced apart from each other in the second direction D2 by the lower contact plugs 475.

The lower contact plug layer 470 may include, e.g., doped polysilicon.

Figure 31:
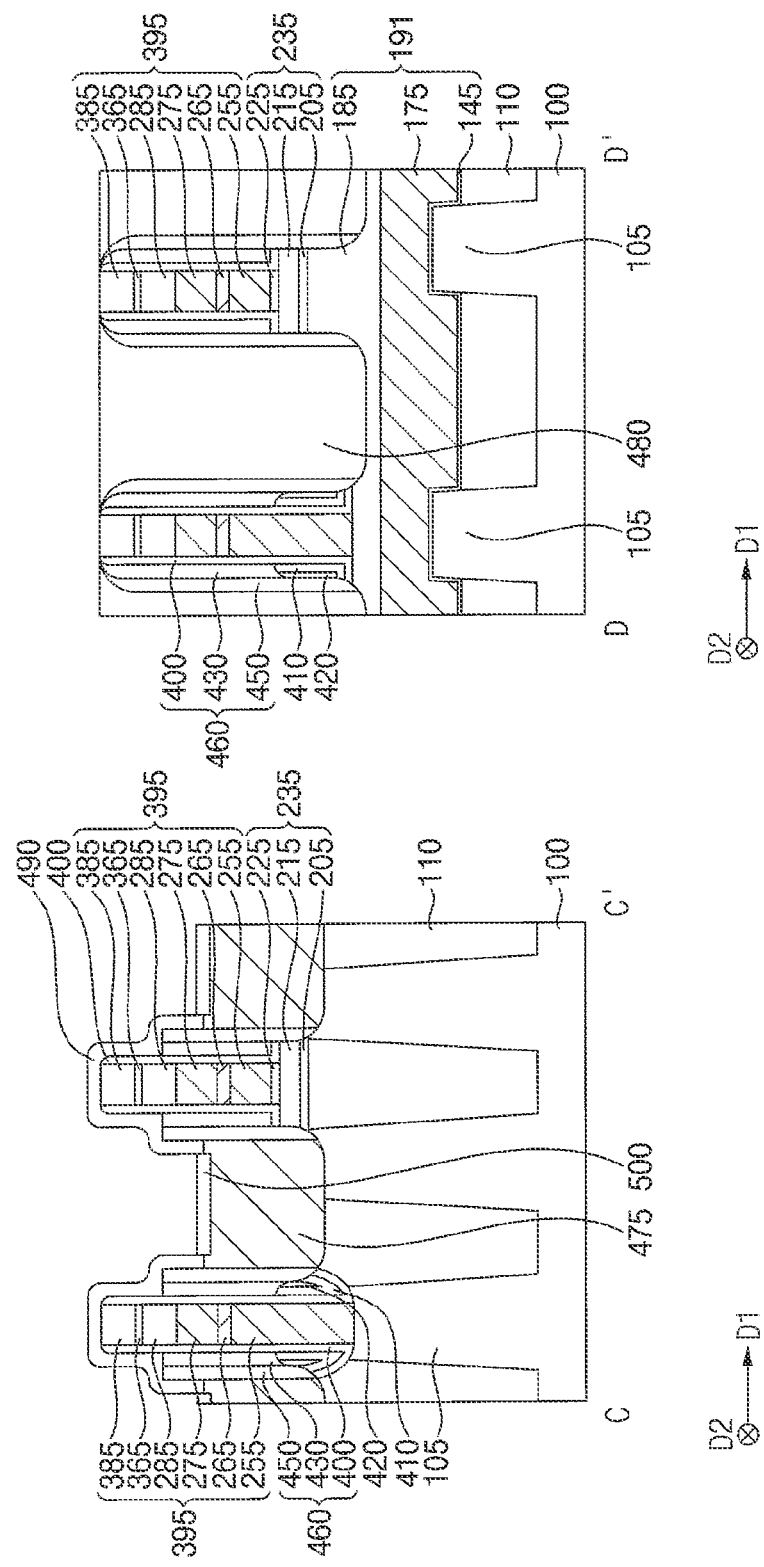

Referring to FIG. 31, an upper portion of the lower contact plug layer 475 may be removed to expose an upper portion of the preliminary spacer structure 460 on the sidewall of the bit line structure 395, and upper portions of the second and third spacers 430 and 450 of the exposed preliminary spacer structure 460 may be removed.

An upper portion of the lower contact plug 475 may be further removed. Thus, an upper surface of the lower contact plug 475 may be lower than uppermost surfaces of the second and third spacers 430 and 450.

A fourth spacer layer may be formed on the bit line structure 395, the preliminary spacer structure 460, the second capping pattern 480 and the lower contact plug 475, and may be anisotropically etched to form a fourth spacer 490 covering an upper portion of the preliminary spacer structure 460 on each of opposite sidewalls in the first direction D1 of the bit line structure 395, and thus an upper surface of the lower contact plug 475 may be exposed.

A metal silicide pattern 500 may be formed on the exposed upper surface of the lower contact plug 475. In example embodiments, the metal silicide pattern 500 may be formed by forming a first metal layer on the first and second capping patterns 385 and 480, the fourth spacer 490 and the lower contact plug 475, performing a heat treatment on the first metal layer, and removing an unreacted portion of the first metal layer. The metal silicide pattern 500 may include, e.g., cobalt silicide, nickel silicide, titanium silicide, etc.

Figure 33:
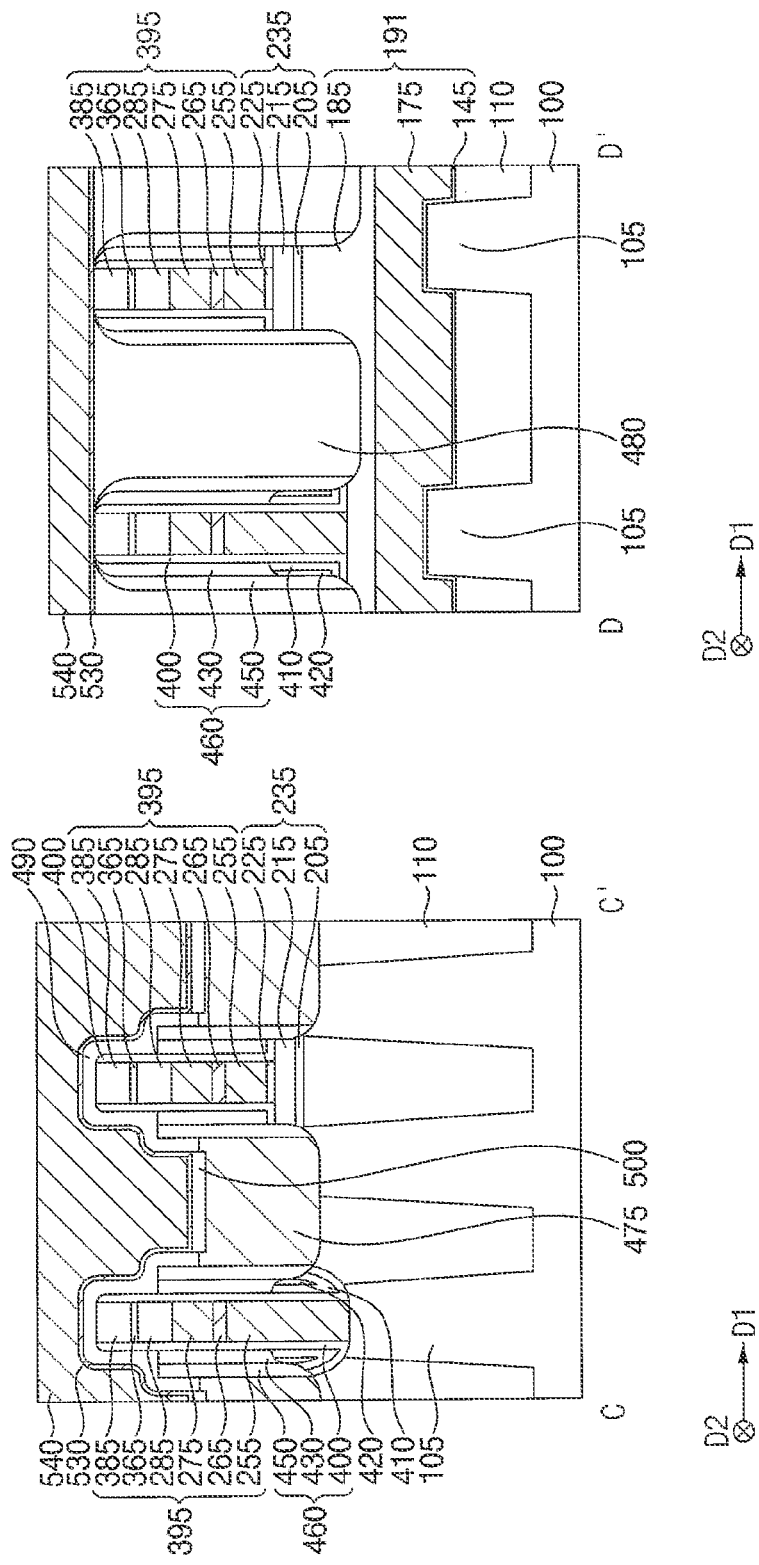

Referring to FIGS. 32 and 33, a second barrier layer 530 may be formed on the first and second capping patterns 385 and 480, the fourth spacer 490, the metal silicide pattern 500 and the lower contact plug 475 on the substrate 100, and a second metal layer 540 may be formed on the second barrier layer 530 to fill a space between the bit line structures 395.

A planarization process may be performed on an upper portion of the second metal layer 540. The planarization process may include a CMP process and/or an etch back process.

Figure 35:
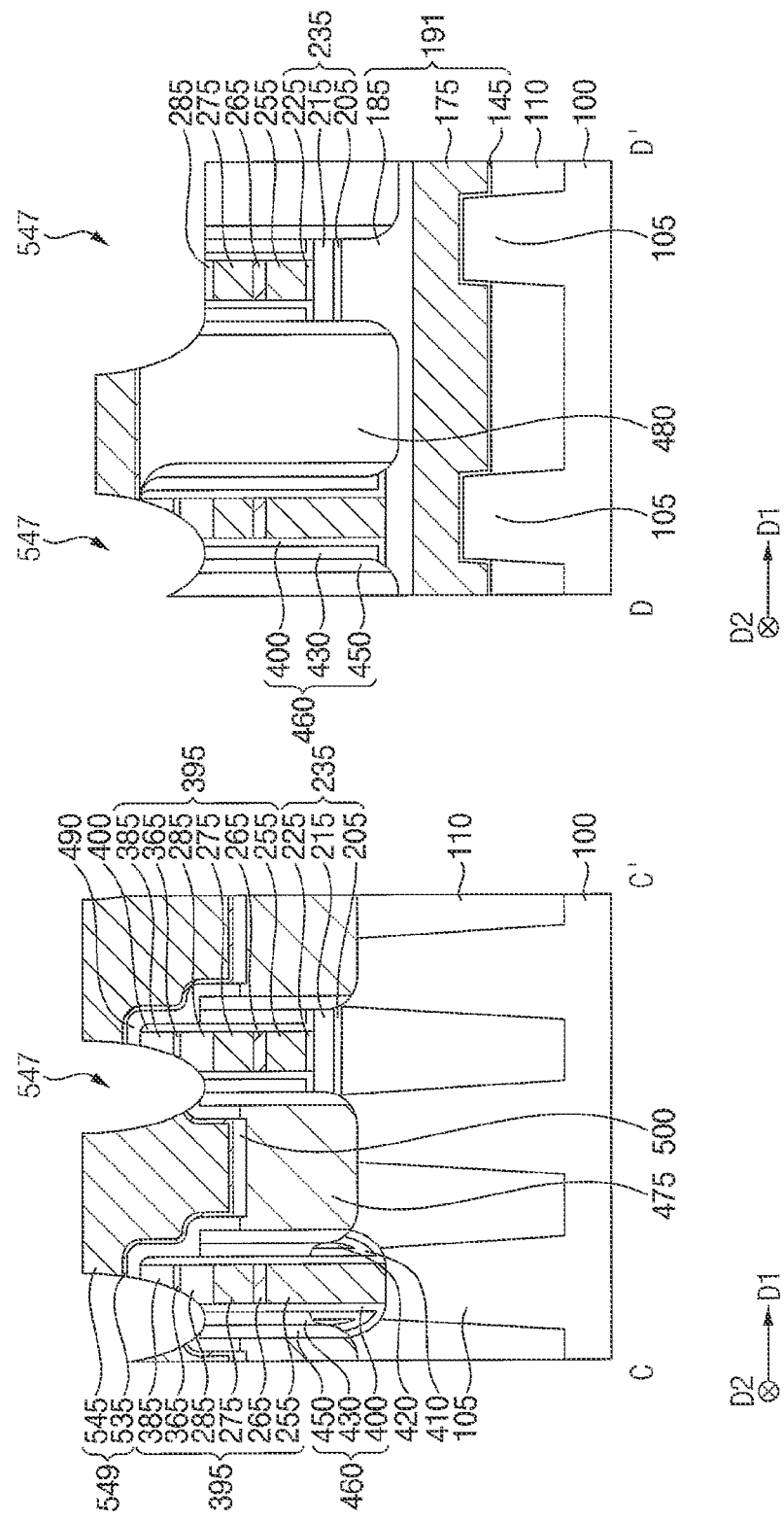

Referring to FIGS. 34 and 35, the second metal layer 540 and the second barrier layer 530 may be patterned to form an upper contact plug 549, and a fifth opening 547 may be formed between the upper contact plugs 549.

The fifth opening 547 may be formed by partially removing not only the second metal layer 540 and the second barrier layer 530, but also the first and second capping patterns 385 and 480, the fourth spacer 490, the first etch stop pattern 365 and the first mask 285, and thus an upper surface of the second spacer 430 may be exposed.

As the fifth opening 547 is formed, the second metal layer 540 and the second barrier layer 530 may be transformed into a second metal pattern 545 and a second barrier pattern 535, respectively, covering a lower surface and a sidewall of the second metal pattern 545, which may form an upper contact plug 549. In example embodiments, a plurality of upper contact plugs 549 may be spaced apart from each other in the first and second directions D1 and D2, and may be arranged in a honeycomb pattern in a plan view. Each of the upper contact plugs 549 may have a shape of a circle, ellipse, or polygon.

The lower contact plug 475, the metal silicide pattern 500 and the upper contact plug 549 sequentially stacked on the substrate 100 may form a contact plug structure.

Figure 36:
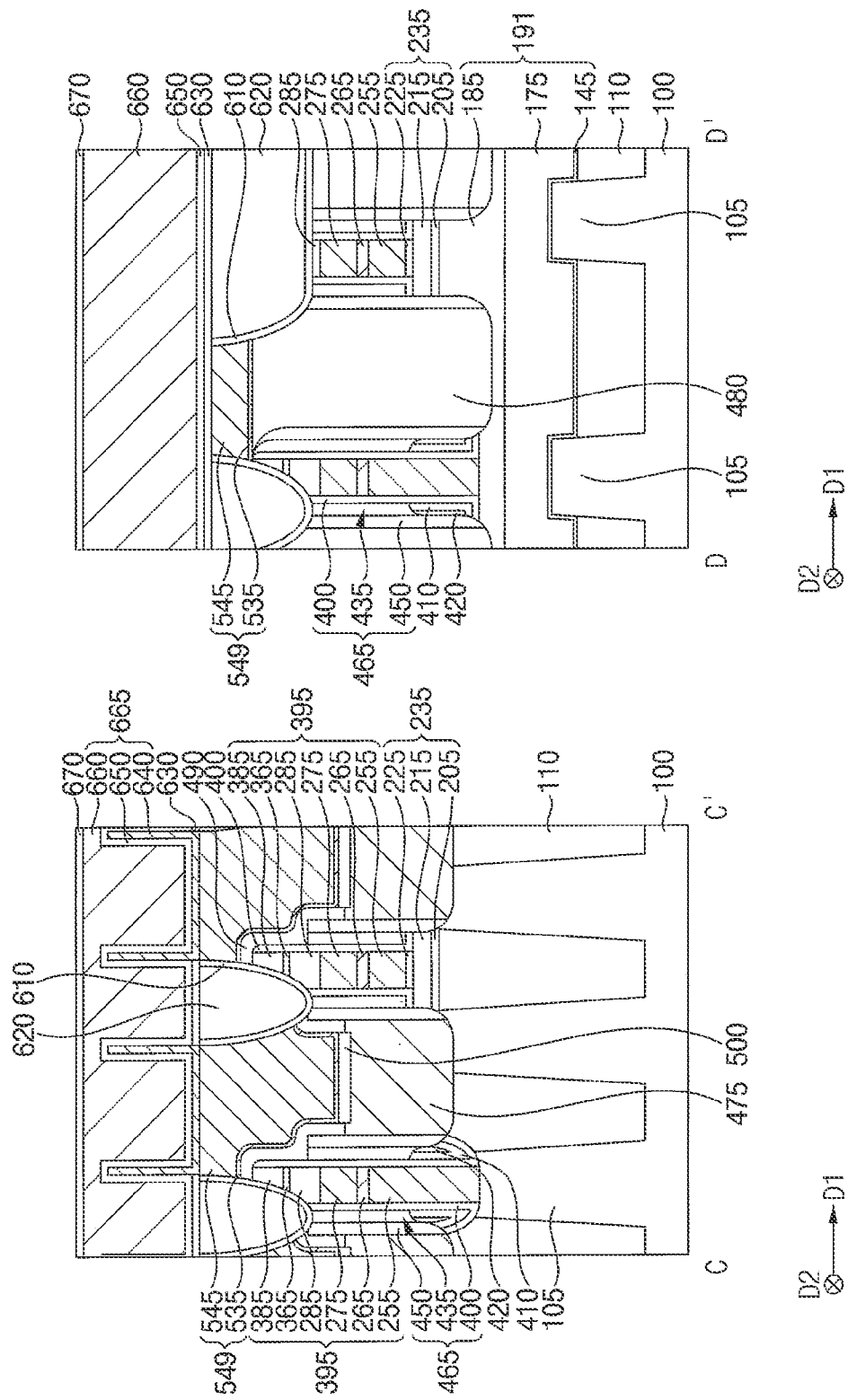

Referring to FIG. 36, the exposed second spacer 430 may be removed to form an air gap 435 connected with the fifth opening 547. The second spacer 430 may be removed by, e.g., a wet etching process.

In example embodiments, in the second spacer 430 on the sidewall of the bit line structure 395 extending in the second direction D2, not only a portion of the second spacer 430 directly exposed by the fifth opening 547 but also a portion thereof parallel to the above portion may be removed. That is, not only a portion of the second spacer 430 exposed by the fifth opening 547 not to be covered by the upper contact plug 549 but also a portion of the second spacer 430 covered by the upper contact plug 549 may be removed.

An insulating interlayer may be formed to fill the fifth opening 547.

In example embodiments, the insulating interlayer may include sixth and seventh insulation layers 610 and 620. The sixth insulation layer 610 may include an insulating material having a low gap-filling characteristic, and thus a gap 435 under the fifth opening 547 may not be filled. The gap 435 may be referred to as an air spacer 435, and the first and third spacers 400 and 450 and the spacer 435 may form a spacer structure 465. The gap 435 may be a spacer including air. For example, the seventh insulation layer 620 may include an oxide, e.g., silicon oxide or a nitride, e.g., silicon nitride. The term "gap" may be, for example, any void or cavity and may be a gap filled with air (e.g., an air gap), a gap filled with an inert gas or gases (e.g., an inert gas gap) or a gap defining a vacuum (e.g., a vacuum gap).

A capacitor 665 may be formed to cover an upper surface of the upper contact plug 549.

Particularly, a second etch stop layer 630 and a mold layer (not shown) may be sequentially formed on the upper contact plug 549 and the insulating interlayer and may be partially etched to form a sixth opening partially exposing an upper surface of the upper contact plug 549. A second etch stop layer 630 may include a nitride, e.g., silicon nitride.

A lower electrode layer (not shown) may be formed on a sidewall of the sixth opening, the exposed upper surface of the upper contact plug 549 and the mold layer, a sacrificial layer (not shown) may be formed on the lower electrode layer to fill the sixth opening, and the lower electrode layer and the sacrificial layer may be planarized until an upper surface of the mold layer is exposed to divide the lower electrode layer. The sacrificial layer and the mold layer may be removed by, e.g., a wet etching process, and thus a cylindrical lower electrode 640 may be formed on the exposed upper surface of the upper contact plug 549. Alternatively, a pillar shaped lower electrode 640 entirely filling the sixth opening may be formed. For example, the lower electrode 640 may include a metal, a metal nitride, a metal silicide, doped polysilicon, etc.

A dielectric layer 650 may be formed on a surface of the lower electrode 640 and the second etch stop layer 630, an upper electrode 660 may be formed on the dielectric layer 650 to form the capacitor 665 include the lower electrode 640, the dielectric layer 650 and the upper electrode 660. Thus, the fabrication of the semiconductor device may be completed.

For example, the dielectric layer 650 may include, e.g., a metal oxide, the upper electrode 660 may include, e.g., a metal, a metal nitride, a metal silicide, doped poly, etc.

The semiconductor device may include the first gate structure 191 that may extend in the first direction D1 in a straight line, and may have enhanced electrical characteristics. The semiconductor device may have following structural characteristics.

In example embodiments, the semiconductor device may include the active pattern 105 on the substrate 100, the isolation pattern 110 covering a sidewall of the active pattern 105, the first gate structure 191 extending in the first direction D1 and being buried in upper portions of the active pattern 105 and the isolation pattern 110, the bit line structure 395 contacting a central upper surface of the active pattern 105 and extending in the second direction D2, the contact plug structure contacting an upper surface of one of opposite ends of the active pattern 105 and including the lower contact plug 475, the metal silicide pattern 500 and the upper contact plug 549 sequentially stacked, and the capacitor 665 on the contact plug structure. An upper surface of the active pattern 105 may include a central portion in its longitudinal direction (e.g., the third direction D3) and an edge portion in its longitudinal direction. The edge portion of the upper surface of the active pattern 105 may be adjacent or may include one of opposing ends in the longitudinal direction of the active pattern 105. The bit line structure 395 may contact the central portion of the upper surface of the active pattern 105, and the contact plug structure may contact the edge portion of the upper surface of the active pattern 105.

In example embodiments, the active pattern 105 may extend in the third direction D3, and a plurality of active patterns 105 may be spaced apart from each other in the first and second directions D1 and D2. Additionally, a plurality of first gate structures 191 may be spaced apart from each other in the second direction D2, and a plurality of bit line structures 395 may be spaced apart from each other in the first direction D1.

While the present inventive concept have been shown and described with reference to example embodiments thereof, it will be understood by those of ordinary skill in the art that various changes in form and details may be made thereto without departing from the scope of the present inventive concept as set forth by the following claims.

What is claimed is:

1. A gate structure comprising:
   a first gate electrode extending in a first direction;
   a second gate electrode on a first portion of the first gate electrode;
   a gate mask on the first and second gate electrodes; and
   a gate insulation pattern that contacts a lower surface and a sidewall of the first gate electrode and contacts sidewalls of the second gate electrode and the gate mask,
   wherein the gate structure is in an upper portion of a substrate, and
   wherein a grain size of the second gate electrode is greater than a grain size of the first gate electrode.

2. The gate structure according to claim 1, wherein the second gate electrode is one of a plurality of second gate electrodes that are spaced apart from each other in the first direction on the first gate electrode.

3. The gate structure according to claim 2, wherein a length in the first direction of an upper surface of each of the plurality of second gate electrodes is greater than a length in the first direction of an upper surface of a second portion of the first gate electrode, and the second portion of the first gate electrode is between neighboring ones of the plurality of second gate electrodes and is not covered by the plurality of second gate electrodes.

4. The gate structure according to claim 1, wherein an upper surface of a second portion of the first gate electrode is substantially coplanar with an upper surface of the second gate electrode.

5. The gate structure according to claim 1, wherein the gate mask includes a portion that is on the first gate electrode and does not overlap the second gate electrode in a vertical direction that is substantially perpendicular to an upper surface of the substrate, and
the portion of the gate mask includes:
a lower portion having a first width in a second direction crossing the first direction; and
an upper portion on and contacting the lower portion, the upper portion having a second width in the second direction, and the second width being greater than the first width.

6. The gate structure according to claim 5, wherein the gate insulation pattern covers a sidewall of the lower portion of the gate mask and contacts a lower surface of the upper portion of the gate mask.

7. The gate structure according to claim 1, wherein the second gate electrode separates the first portion of the first gate electrode from the gate mask and contacts the gate mask, and the first gate electrode includes a second portion contacting the gate mask.

8. A gate structure comprising:
a first gate electrode extending in a first direction;
a first gate mask on a first region of the first gate electrode;
a second gate mask on a second region of the first gate electrode, the second gate mask including:
a lower portion having a first width in a second direction crossing the first direction; and
an upper portion on and contacting the lower portion, the upper portion having a second width in the second direction, and the second width being greater than the first width; and
a gate insulation pattern on a lower surface and a sidewall of the first gate electrode, a sidewall of the first gate mask, and a sidewall of the lower portion of the second gate mask, and the gate insulation pattern contacting a portion of a lower surface of the upper portion of the second gate mask,
wherein the gate structure is in an upper portion of a substrate.

9. The gate structure according to claim 8, wherein the second gate mask is one of a plurality of second gate masks spaced apart from each other in the first direction on the first gate electrode.

10. The gate structure according to claim 9, wherein a length in the first direction of an upper surface of each of the plurality of second gate masks is less than a length in the first direction of an upper surface of the first gate mask.

11. The gate structure according to claim 8, wherein the upper portion of the second gate mask has a shape of a circle, an ellipse, a polygon or a polygon with rounded corners in a plan view.

12. The gate structure according to claim 8, wherein an upper surface of the first gate mask is substantially coplanar with an upper surface of the upper portion of the second gate mask.

13. The gate structure according to claim 8, further comprising a second gate electrode between the first gate electrode and the first gate mask, the second gate electrode having a grain size greater than a grain size of the first gate electrode.

14. A semiconductor device comprising:
an active pattern on a substrate;
an isolation pattern on a sidewall of the active pattern;
a gate structure in upper portions of the active pattern and the isolation pattern, the gate structure extending in a first direction that is parallel to an upper surface of the substrate;
a bit line structure contacting a central portion in a longitudinal direction of an upper surface of the active pattern and extending in a second direction that is parallel to the upper surface of the substrate and is perpendicular to the first direction;
a contact plug structure contacting an edge portion in the longitudinal direction of the upper surface of the active pattern; and
a capacitor on the contact plug structure,
wherein the gate structure includes:
a first gate electrode extending in the first direction;
a second gate electrode on a first portion of the first gate electrode; and
a gate mask on the first and second gate electrodes; and
a gate insulation pattern contacts a lower surface and a sidewall of the first gate electrode and contacts sidewalls of the second gate electrode and the gate mask, and
wherein a grain size of the second gate electrode is greater than a grain size of the first gate electrode.

15. The semiconductor device according to claim 14, wherein the longitudinal direction of the upper surface of the active pattern forms an acute angle with the first and second directions, and the active pattern is one of a plurality of active patterns spaced apart from each other in the first and second directions, and
wherein the gate structure is one of a plurality of gate structures spaced apart from each other in the second direction, and the bit line structure is one of a plurality of bit line structures spaced apart from each other in the first direction.

16. The semiconductor device according to claim 14, wherein the second gate electrode is one of a plurality of second gate electrodes spaced apart from each other in the first direction on the first gate electrode.

17. The semiconductor device according to claim 16, wherein a length in the first direction of an upper surface of each of the plurality of second gate electrodes is greater than a length in the first direction of an upper surface of a second portion of the first gate electrode, and the second portion of the first gate electrode is between neighboring ones of the plurality of second gate electrodes and is not covered by the plurality of second gate electrodes.

18. The semiconductor device according to claim 14, wherein an upper surface of a second portion of the first gate electrode is substantially coplanar with an upper surface of the second gate electrode.

19. The semiconductor device according to claim 14, wherein the gate mask includes a portion that is on the first gate electrode and does not overlap the second gate electrode in a vertical direction that is substantially perpendicular to the upper surface of the substrate, and
the portion of the gate mask includes:
a lower portion having a first width in the second direction; and
an upper portion on and contacting the lower portion, the upper portion having a second width in the second direction, and the second width being greater than the first width.

20. The semiconductor device according to claim 19, wherein the gate insulation pattern covers a sidewall of the lower portion of the gate mask and contacts a lower surface of the upper portion of the gate mask.

* * * * *